US012757650B2

(12) United States Patent
Glavin et al.

(10) Patent No.: US 12,757,650 B2
(45) Date of Patent: Oct. 6, 2026

(54) METHOD OF INCREASING SENSITIVITY AND LIMITS OF DETECTION AND CONTROLLING FLUID FLOW OVER SENSOR AND SENSOR ARRAY

(71) Applicant: Government of the United States, as represented by the Secretary of Air Force, Wright-Patterson AFB, OH (US)

(72) Inventors: Nicholas R. Glavin, Springboro, OH (US); Christopher Muratore, Kettering, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 688 days.

(21) Appl. No.: 17/957,293

(22) Filed: Sep. 30, 2022

(65) Prior Publication Data

US 2023/0045818 A1 Feb. 16, 2023

Related U.S. Application Data

(63) Continuation-in-part of application No. 17/523,721, filed on Nov. 10, 2021, now Pat. No. 12,654,197, (Continued)

(51) Int. Cl.
*H10P 14/20* (2026.01)
*H10D 62/40* (2025.01)

(52) U.S. Cl.
CPC ......... *H10P 14/3816* (2026.01); *H10D 62/40* (2025.01); *H10P 14/2922* (2026.01); (Continued)

(58) Field of Classification Search
CPC ............ H01L 21/02683; H01L 21/324; H01L 21/428; H01L 21/0267
See application file for complete search history.

(56) References Cited

U.S. PATENT DOCUMENTS 3,138,743 A 6/1964 Kilby
5,515,241 A 5/1996 Werther
(Continued)

OTHER PUBLICATIONS

Lu et al. ("Layer-by-layer thinning of MoS2 by thermal annealing." Nanoscale 5, 8904-8908 (2013). DOI: 10.1039/c3nr03101b) (Year: 2019).*
(Continued)

*Primary Examiner* — Yara B Green
*Assistant Examiner* — Erika H Son
(74) *Attorney, Agent, or Firm* — AFMCLO/JAZ; Jeffrey V. Bamber; James F. McBride

(57) ABSTRACT

A process of making sensors and sensor arrays that has the ability to manipulate of the morphology or flow of an applied drop or sample over the sensor array surface at any point in the patterning process and sensors and sensor arrays having increased sensitivity and limits of detection. In addition, said process can provided real time notification of any centerline deviation. Such production process can be adjusted in real time. Thus, large numbers of units can be made—even in millions of per day—with few if any out of specification units being produced. Such process does not require large-scale clean rooms and is easily configurable.

22 Claims, 19 Drawing Sheets

Related U.S. Application Data which is a continuation-in-part of application No. 17/336,799, filed on Jun. 2, 2021, now Pat. No. 12,622,239, which is a continuation-in-part of application No. 17/216,729, filed on Mar. 30, 2021, now Pat. No. 12,599,988.

(60) Provisional application No. 63/001,604, filed on Mar. 30, 2020.

(52) U.S. Cl.
CPC ...... *H10P 14/3238* (2026.01); *H10P 14/3241* (2026.01); *H10P 14/3251* (2026.01); *H10P 14/3814* (2026.01)

(56) References Cited

U.S. PATENT DOCUMENTS

| | | | | |
|---|---|---|---|---|
| 5,526,280 | A | 6/1996 | Consadori et al. | |
| 10,418,237 | B2 | 9/2019 | Glavin et al. | |
| 10,429,381 | B2 | 10/2019 | Hoffman | |
| 10,770,483 | B2 * | 9/2020 | Sugawara | H10D 30/6756 |
| 10,875,339 | B1 * | 12/2020 | Claussen | G03F 7/0002 |
| 11,469,351 | B2 * | 10/2022 | Li | H10F 77/12 |
| 12,123,845 | B2 * | 10/2024 | Mahjouri-Samani | G01N 27/4145 |
| 2006/0246632 | A1 | 11/2006 | Okumura | |
| 2012/0043546 | A1 | 2/2012 | Oh | |
| 2018/0308692 | A1 * | 10/2018 | Muratore | H10D 62/80 |
| 2020/0090933 | A1 | 3/2020 | Muratore | |
| 2021/0299781 | A1 | 9/2021 | Glavin et al. | |
| 2021/0299789 | A1 | 9/2021 | Glavin et al. | |
| 2021/0301381 | A1 | 9/2021 | Glavin et al. | |
| 2021/0313188 | A1 | 10/2021 | Glavin et al. | |
| 2021/0325380 | A1 * | 10/2021 | Muthukumar | G01N 33/5438 |
| 2022/0140147 | A1 * | 5/2022 | Choe | H10D 1/68 257/295 |
| 2022/0270891 | A1 * | 8/2022 | Currie | H01L 21/477 |
| 2023/0148461 | A9 | 5/2023 | Glavin et al. | |
| 2023/0152309 | A9 | 5/2023 | Glavin et al. | |

OTHER PUBLICATIONS

Li et al. ("The Stability of Metallic MoS2 Nanosheets and Their Property Change by Annealing." Nanomaterials, 9, 1366 (2019). DOI : 10.3390/nano9101366). (Year: 2013).*
Park et al. ("Laser-directed synthesis of strain-induced crumpled MoS2 structure for enhanced triboelectrification toward haptic sensors." Nano Energy, 78, 105266 (2020). DOI: 10.1016/j.nanoen.2020.105266). (Year: 2020).*
Wells et al. ("Roll-to-Roll Deposition of Semiconducting 2D Nanoflake Films of Transition Metal Dichalcogenides for Optoelectronic Applications." ACS Appl. Nano Mater., 2, 7705-7712 (2019). DOI: 10.1021/acsanm.9b01774). (Year: 2019).*
Rajeev et al. ("Laser patterned polymer/nanotube composite electrodes for nanowire transistors on flexible substrates." arXiv: Applied Physics (2017). DOI: 10.48550/arXiv.1711.06925). (Year: 2017).*
Mcconny, M.E. et al.; "Direct synthesis of ultra-thin large area transition metal dichalcogenides and their heterostructures on stretchable polymer surfaces," J. of Mat. Res., 2016, 0, 0, 1-8.
Sirota, B. et al. "Room temperature magnetron sputtering and laser annealing of ultrathin MoS2 for flexible transistors, " Vacuum, 2019, 160, 133-138.
Kim, R. H. et al.; "Photonic Crystallization of MoS2 for Stretchable Photodetectors," Nanoscale, 2019, 11, 13260-13268.
Galvin, N. R.; IEEE Presentation Rapid Conference in Miramar Beach, FL. Aug. 20, 2019, 1-44.
Ahmadi, Z. et al."Self-limiting laser crystallization and direct writing of 2D materials" Int. J. Extrem. Manuf. 2019, 1, 015001, 1-8.
Vilá, R. A. . et al "In situ crystallization kinetics of two-dimensional MoS2" 2D Mater. 5 2018, 5, 011009, 1-8.
Muratore, C. "Biofunctionalized Two-dimensional MoS2 Receptors for Rapid Response Modular Electronic SARS-CoV-2 and Influenza A Antigen Sensors" medrxivorg., Nov. 20, 2020, 1-11.
Muratore, C. "Beyond point of care diagnostics: Lowdimensional nanomaterials for electronic virus sensing" J. Vac. Sci. Technol. A 2020, 38, 050804, 1-16.
Muratore, C.; Muratore, M.K.; Austin, D.R.; Miesle, P.; Benton, A.K.; Beagle, L.K.; Motala, M.J.; Moore, D.C.; Slocik, J. M.; Brothers, M.C.; Kim, S.S.; Krupa, K.; Back, T.A.; John T. Grant, J.T.; Nicholas R. Glavin, N.R.; Laser-Fabricated 2D Molybdenum Disulfide Electronic Sensor Arrays for Rapid, Low-Cost, Ultrasensitive Detection of Influenza A and SARS-Cov-2, Adv. Mater. Interfaces 2022, 2102209, 1-9.
U.S. Appl. No. 17/216,729, filed Nov. 25, 2024 Non-final Rejection.
Mine, H.; Kobayashi, A.; Nakamura, T.; Inoue, T.; Pakdel, S.; Marian, D.; Gonzalez-Marin, E.; Maruyama, S.; Katsumoto, S.; Fortunelli, A.; Palacios, J.J.; Haruyama, J.; Laser-Beam-Patterned Topological Insulating States on Thin Semiconducting MoS2 2019, Physical Review Letters 123, 146803.
Tan, Y.; Luo, F.; Zhu, M.; Xu, X.; Ye, Y.; Li, B.; Wang, G.; Luo, W.; Zheng, X.; Wu, N.; Yu, Y.; Qin, S.; Zhang, X.; Controllable 2H-to-1T' phase transition in few-layer MoTe2 Nanoscale 2018, 10, 19964-19971.
PCT International Search Report for PCT/US22/20850.
PCT Written Opinion of The International Searching Authority for PCT/US22/20850.
PCT International Search Report for PCT/US22/20851.
PCT Written Opinion of The International Searching Authority for PCT/US22/20851.
PCT International Search Report for PCT/US22/20853.
PCT Written Opinion of The International Searching Authority for PCT/US22/20853.
Castellanos-Gomez et al. ("Laser-thinning of MoS2: On-Demand Generation of a Single-Layer Semiconductor." Nano Letters. vol. 12, No. 6, 3187-3192 (2012). DOI: 10.1021/nl301164v).
Kukkar et al. ("A New Electrolytic Synthesis Method for Few Layered MoS2 Nanosheets and Their Robust Biointerfacing With Reduced Antibodies." ACS Applied Materials & Interfaces, 8, 16555-16563 (2016). DOI: 10.1021/acsami.6b03079).
U.S. Appl. No. 17/336,855, filed Feb. 13, 2025 Non-final Rejection.
U.S. Appl. No. 17/336,799, filed Mar. 3, 2025 Non-final Rejection.
Austin Drake et al: "Laser writing of electronic circuitry in thin film molybdenum disulfide: A transformative manufacturing approach", Materials Today 2020, 43, pp. 17-26.
Yi Rang Lim et al: "Roll-to-Roll Production of Layer-Controlled Molybdenum Disulfide: A Platform for 2D Semiconductor-Based Industrial Applications", Advanced Materials, 2018, 30,1705270, pp. 1-8.
Rai Rachel H et al: "Pulsed laser annealing of amorphous two-dimensional transition metal dichalcogenides" J. Vac. Sci. Technol. 2020, A 38, 052201, pp. 1-7.
PCT International Search Report for PCT/US22/20854.
PCT Written Opinion of The International Searching Authority for PCT/US22/20854.
U.S. Appl. No. 17/216,729, filed Apr. 21, 2025 Final Rejection.
U.S. Appl. No. 17/336,799, filed Mar. 31, 2025 Non-final Rejection.
U.S. Appl. No. 17/523,705, filed Jun. 5, 2025 Non-final Rejection.
U.S. Appl. No. 17/523,721, filed Apr. 15, 2025 Non-final Rejection.
U.S. Appl. No. 17/957,293, filed Apr. 15, 2025 Non-final Rejection.
Supplemental information for Kukkar, et al. "A New Electrolytic Synthesis Method for Few Layered MoS2 Nanosheets and Their Reduced Antibodies", ACS Applied Materials & Interfaces, 8, 16555-16563 (2016). DOI: 10.1021/acsami.6b03079. (Year: 2016).
Zhang, et al. "Protocell arrays for simulatneous detection of diverse analytes", Nat Commun 12, 5724 (2001). DOE: 10.1038/s41467-021-25989-3. (Year: 2021).
Lee, et al. "Two-dimensional Layered MoS2 Biosensors Enable Highly Sensitive Detection of Biomolecules", Sci Rep 4, 7352 (2014). DOI: 10.1038/srep07352. (Year: 2014).
Windom, et al. "A Raman Spectroscopic Study of MoS2 and MoO3: Applications to Tribological Systems", Tribol Lett 42, 301-310 (2011). DOI: 10.1007/s11249-011-9774-x) (Year: 2011).

(56) References Cited

OTHER PUBLICATIONS

Lu, et al., "Layer-by-layer thinning of MoS2 by thermal annealing", Nanoscale 5, 8904-8908 (2013). DOI: 10.1039/c3nr03101b (Year: 2013).
Li, et al., "The Stability of Metallic MoS2 Nanosheets and Their Property Change by Annealing", Nanomaterials, 9, 1366 (2019). DOI: 10.3390/nano9101366. (Year: 2019).
Kang, et al., "High-performance MoS2 transistors with low-resistance molybdenum contacts", Applied Physics Letters 104, 093106 (2014). DOI: 10.1063/1.4866340. (Year: 2014).
U.S. Appl. No. 17/336,855, filed Sep. 12, 2025 Non-final Rejection.
U.S. Appl. No. 17/523,705, filed Oct. 31, 2025 Final Rejection.
Naylor et al. ("Scalable Production of Molybdenum Disulfide Based Biosensors." ACS Nano, 10(6), 6173-6179 (2016). DOI: 10.1021/acsnano.6b02137). (Year: 2016).
Li et al. ("Fibroin-like Peptides Self-Assembling on Two-Dimensional Materials as a Molecular Scaffold for Potential Biosensing." ACS Applied Materials & Interfaces, 11, 20670-20677 (2019). DOI: 10.1021/acsami.9b04079). (Year: 2019).
Kang et al. ("Controllable atomic-ratio of CVD-grown MoS2-MoO2 hybrid catalyst by soft annealing for enhancing hydrogen evolution reaction." International Journal of Hydrogen Energy, 45, 1399-1408 (2020). DOI: 10.1016/j.ijhydene.2019.11.066). (Year: 2019).
U.S. Appl. No. 17/523,705, filed Jun. 10, 2026 Non-final Rejection.

* cited by examiner ablated isolation lines

METHOD OF INCREASING SENSITIVITY AND LIMITS OF DETECTION AND CONTROLLING FLUID FLOW OVER SENSOR AND SENSOR ARRAY

CROSS-REFERENCE TO RELATED APPLICATION

The present application is a continuation-in-part of U.S. patent application Ser. No. 17/523,721 filed Nov. 10, 2021, which in turn is a continuation-in-part of U.S. patent application Ser. No. 17/336,799 filed Jun. 2, 2021, which in turn is a continuation-in-part of U.S. patent application Ser. No. 17/216,729 filed Mar. 30, 2021, which in turn claims priority to U.S. Provisional Application Ser. No. 63/001,604 filed Mar. 30, 2020, the contents of U.S. patent application Ser. No. 17/523,721, U.S. patent application Ser. No. 17/336,799, U.S. patent application Ser. No. 17/216,729 and U.S. Provisional Application Ser. No. 63/001,604 hereby being incorporated by reference in their entry.

RIGHTS OF THE GOVERNMENT

The invention described herein may be manufactured and used by or for the Government of the United States for all governmental purposes without the payment of any royalty.

FIELD OF THE INVENTION

The present invention relates to a sensor and sensor array production.

BACKGROUND OF THE INVENTION

Current sensors and sensor arrays that are used to sense/detect materials such as viruses, bacteria and chemicals are costly to make and/or use. The processes used to make current sensors and sensor arrays do not have the ability to manipulate of the morphology or flow of an applied drop or sample over the sensor array surface at any point in the patterning process and current sensors and sensor arrays do not have the needed sensitivity and limit of detection that is needed. Finally, the production of sensor and sensor arrays via roll-to-roll processes are a rapid production process that can deviate from its centerline target and produce thousands of out of specification product units in minutes. Thus, what is needed is a process of making sensors and sensor arrays that has the ability to manipulate of the morphology or flow of an applied drop or sample over the sensor array surface at any point in the patterning process and sensors and sensor arrays having increased sensitivity and limits of detection. Such process should be capable of quickly making units in large numbers—even in millions per day—and yet still provide few if any out of specification units.

Applicants recognized that the source of the problems associated with current sensor and sensory arrays and production of same arose from a few processing conditions amongst many processing variables and that the notification that the production process had deviated from centerline was to slow. Such recognition led Applicants to develop a process of making sensors and sensor arrays that provided surprisingly improved sensor and sensory arrays and real time notification of any centerline deviation. Thus, large numbers of units can be made—even in millions per day—few if any out of specification units being produced. Such process does not require large-scale clean rooms and is easily configurable.

SUMMARY OF THE INVENTION

A process of making sensors and sensor arrays that has the ability to manipulate of the morphology or flow of an applied drop or sample over the sensor array surface at any point in the patterning process and sensors and sensor arrays having increased sensitivity and limits of detection. In addition, said process can provided real time notification of any centerline deviation. Such production process can be adjusted in real time. Thus, large numbers of units can be made—even in millions of per day—with few if any out of specification units being produced. Such process does not require large-scale clean rooms and is easily configurable.

Additional objects, advantages, and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION OF THE INVENTION

Definitions

Figure 1:
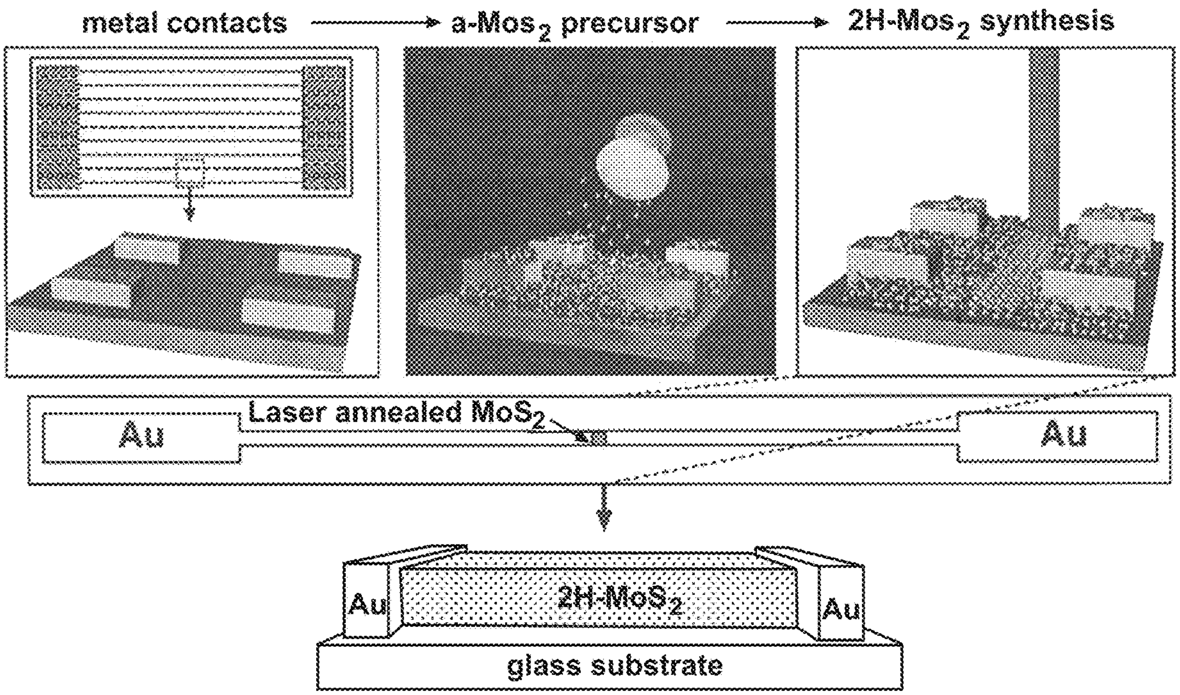
FIG. 1 is a schematic depicting the process of coating $MoS_2$ onto patterned metal contacts followed by laser conversion to 2H-phase $MoS_2$ device.

Unless specifically stated otherwise, as used herein, the terms "a", "an" and "the" mean "at least one".

As used herein, the terms "include", "includes" and "including" are meant to be non-limiting.

As used herein, the words "about," "approximately," or the like, when accompanying a numerical value, are to be construed as indicating a deviation as would be appreciated by one of ordinary skill in the art to operate satisfactorily for an intended purpose.

As used herein, the words "and/or" means, when referring to embodiments (for example an embodiment having elements A and/or B) that the embodiment may have element A alone, element B alone, or elements A and B taken together.

Unless otherwise noted, all component or composition levels are in reference to the active portion of that component or composition, and are exclusive of impurities, for example, residual solvents or by-products, which may be present in commercially available sources of such components or compositions.

All percentages and ratios are calculated by weight unless otherwise indicated. All percentages and ratios are calculated based on the total composition unless otherwise indicated.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

Process of Making Sensor Comprising Pattern Illumination-Based Annealed Coated Substrate and One or More Functional Molecules For purposes of this specification, headings are not considered paragraphs and thus this paragraph is paragraph thirty-seven of the present specification. The individual number of each paragraph above and below this paragraph can be determined by reference to this paragraph's number. In this paragraph thirty-seven, Applicants disclose a process of making a sensor or sensor array said process comprising;

a.) illumination patterning and/or thermal annealing a coated substrate comprising a substrate having a first side and a second side, (i) said substrate's first side comprising; one or more coatings of patterned electrical conductive material disposed over said substrate's first side, preferably said patterned electrical conductive material comprises a material selected from the group consisting of poly(3,4-ethylenedioxythiophene), poly(3,4-ethylenedioxythiophene) polystyrene sulfonate, poly(pyrrole), polycarbazoles, polyindoles, polyazepines, Cr, Mo, Ti, Sc, Ni, V, Hf, W, Nb, Au, Ag, Cu, and Pt and mixtures thereof; more preferably said patterned electrical conductive material comprises a metal selected from the group consisting of Cr, Mo, Ti, Sc, Ni, V, Hf, W, Nb, Au, Ag, Cu, and Pt and mixtures thereof, most preferably said metal comprises a metal selected from the group consisting of Mo, Cr, Ti, Au and mixtures thereof, most preferably said one or more coatings of patterned electrical conductive material is a coating of Mo, a coating of Cr and a second coating of Au over said coating of Cr or a coating of Ti and a second coating of Au over said coating of Ti; and one or more chemical coatings disposed over said one or more coatings of patterned electrical conductive material, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$, and mixtures thereof;

(ii) said substrate's second side optionally comprising one or more coatings of patterned electrical conductive material disposed over said substrate's first side, preferably said patterned electrical conductive material comprises a material selected from the group consisting of poly(3,4-ethylenedioxythiophene), poly(3,4-ethylenedioxythiophene) polystyrene sulfonate, poly(pyrrole), polycarbazoles, polyindoles, polyazepines, Cr, Mo, Ti, Sc, Ni, V, Hf, W, Nb, Au, Ag, Cu, and Pt and mixtures thereof; more preferably said patterned electrical conductive material comprises a metal selected from the group consisting of Cr, Mo, Ti, Sc, Ni, V, Hf, W, Nb, Au, Ag, Cu, and Pt and mixtures thereof, most preferably said metal comprises a metal selected from the group consisting of Mo, Cr, Ti, Au and mixtures thereof, most preferably said one or more coatings of patterned electrical conductive material is a coating of Mo, a coating of Cr and a second coating of Au over said coating of Cr or a coating of Ti and a second coating of Au over said coating of Ti; and one or more chemical coatings disposed over said one or more coatings of patterned electrical conductive material, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$ and mixtures thereof;

said illumination patterning comprising using one or more lasers and/or lamps to achieve at least structural change and optionally a chemical change in at least a portion of at least one of said one or more chemical coatings on at least one side of said substrate, and optionally the removal of at least a portion of said chemical coating on at least one side of said substrate, said thermal annealing comprising thermal annealing said at least a portion of said coated substrate's chemical coating, said at least a portion of said coated substrate's annealed chemical coating's thermal annealing treatment temperature being from about 0° C. to about 1,500° C., preferably said at least a portion of said coated substrate's chemical coating's thermal annealing treatment temperature being from about 5° C. to about 1,000° C., more preferably said at least a portion of said coated substrate's chemical coating's thermal annealing treatment temperature being from about 5° C. to about 900° C., preferably said at least a portion of said coated substrate's annealed chemical coating's thermal annealing treatment temperature being from about 18° C. to about 700° C., preferably said thermal annealing is conducted under a pressure of from about $10\times10^{-10}$ Torr to about 7000 Torr; preferably about $10^{-9}$ to about 1000 Torr; more preferably about $10^{-8}$ Torr to 10 Torr, and most preferably about $10^{-6}$ Torr to about 1 Torr in an atmosphere comprising nitrogen, oxygen, argon, helium, hydrogen, hydrogen sulfide, hydrogen selenide and mixtures thereof, preferably said atmosphere comprises nitrogen, argon, hydrogen and mixtures thereof, more preferably said atmosphere comprises at least 75% nitrogen and the balance of said atmosphere comprising argon and/or hydrogen, or said atmosphere comprises at least 75% argon and the balance of said atmosphere comprising nitrogen and/or hydrogen; more preferably said atmosphere comprises at least 85% nitrogen and the balance of said atmosphere comprising argon and/or hydrogen, or said atmosphere comprises at least 85% argon and the balance of said atmosphere comprising nitrogen and/or hydrogen; more preferably said atmosphere comprises at least 90% nitrogen and the balance of said atmosphere comprising argon and/or hydrogen, or said atmosphere comprises at least 90% argon and the balance of said atmosphere comprising nitrogen and/or hydrogen; most preferably said atmosphere comprises at least 95% nitrogen and the balance of said atmosphere comprising argon and/or hydrogen, or said atmosphere comprises at least 95% argon and the balance of said atmosphere comprising nitrogen and/or hydrogen; preferably, said illumination patterning comprises contacting, from about 1 to about 1000 times, preferably 1 to about 100 times, more preferably 1 to about 50 times, most preferably 1 to about 10 times said surface with a continuous wave (CW) and/or pulsed laser each continuous wave (CW) and/or pulsed laser independently having a pulse frequency of from about 0.1 Hz to about 1000 kHz, preferably said pulse frequency is from about 1 Hz to about 500 kHz, more preferably said pulse frequency is from about 10 Hz to about 100 kHz, and most preferably said pulse frequency is from about 100 Hz to about 100 kHz, a laser power density of from about 0.05 $J/mm^2$ to about 800 $J/mm^2$, preferably, a laser power density of about 0.5 $J/mm^2$ to about 500 $J/mm^2$, more preferably, a laser power density of from about 1 $J/mm^2$ to about 100 $J/mm^2$, most preferably a laser power density of from about 5 $J/mm^2$ to about 80 $J/mm^2$;

b.) optionally, attaching one or more types of functional molecules and/or one or more complexes comprising one or more types of functional molecules and one or more target molecules (as used herein target molecules can be simple molecules or macromolecules including but not limited to proteins, lipids, and carbohydrates, target molecules include aromatics, aromatic halogens, halocarbon, polar aprotics, volatile organic compounds, hazardous gases, for example, arsenic, radon, nitrogen dioxide, carbon monoxide, carbon dioxide, carbon disulfide, ammonia, napthalene, isoprene, terpenes, methanol, benzyl chloride, hexachloro-1,3-butadiene, tribomomethane, 1,4-dioxane) to at least a portion of said illumination patterned and/or thermally annealed coated substrate, said one or types of biomaterial being attached to:

(i) a pattern illumination-based annealed portion of said pattern illumination-based annealed coated substrate and/or a thermally annealed portion of said thermally annealed coated substrate;

(ii) a portion of said pattern illumination-based anneal coated substrate that is not pattern illumination-based annealed; or a portion of said thermally anneal coated substrate that is not thermally annealed; or (iii) a portion of said pattern illumination-based anneal coated substrate that is not pattern illumination-based annealed and a portion of said pattern illumination-based anneal coated substrate that is pattern illumination-based annealed and/or a portion of said thermally annealed coated substrate that is not thermally annealed;

preferably said one or more types of functional molecules are attached to an illumination patterned and thermally annealed portion of said illumination patterned and thermally annealed coated substrate said process comprising an optional quality control unit comprising one or more diagnostic detectors, said one or more diagnostic detectors positioned to collect light that has interacted with said one or more chemical coatings at the point of and/or after said pattern illumination-based annealing and/or thermal annealing has occurred, preferably said one or more diagnostic detectors are each independently an optical camera, an optical detector, or Raman spectrometer, preferably said quality control unit comprises at least two diagnostic detectors, at least one of said diagnostic detectors positioned to collect light that has interacted with said one or more chemical coatings at the point of said pattern illumination-based annealing and/or thermally annealing; and at least one of said diagnostic detectors positioned to collect light that has interacted with said one or more chemical coatings after said pattern illumination-based annealing and/or thermally annealing has occurred, preferably said collected light that has interacted with said one or more chemical coatings at the point of and/or after said pattern illumination-based annealing and/or thermally annealing has occurred is supplied prior to said interaction by a laser, an LED or a broadband light source, preferably at least a portion of said collected light that has interacted with said one or more chemical coatings at the point of and/or after said pattern illumination-based annealing; and/or at the point of and/or after said thermal annealing has occurred is suppled prior to said interaction by said one or more lasers and/or lamps used to achieve at least one of a chemical change or structural change in at least a portion of at least one of said one or more chemical coatings on at least one side of said substrate; said process being optionally a roll process wherein said chemically coated substrate is a rolled chemically coated substrate that is unrolled at least in part, said unrolled chemical coating portion of said chemically coated substrate being at least in part pattern illumination-based annealed and/or thermally annealed, said process being preferably being a roll process wherein said coated chemically substrate is a rolled coated chemically substrate that is unrolled at least in part, said unrolled chemical coating portion of said coated substrate being at least in part illumination patterned and thermally annealed, in one aspect, said roll process is a roll-to-roll process. Each of said chemical coatings may be disposed over said one or more coatings of patterned electrical conductive material via chemical or physical vapor deposition processes including but not limited to thermal decomposition of one or more precursor gases, thermal evaporation, electron beam evaporation, pulsed laser deposition, magnetron sputtering, pulsed direct current magnetron sputtering, high power impulse magnetron sputtering, and/or molecular beam epitaxy. Applicants further note that Mo and $MoS_2$ will sublime via oxidation at relatively low temperatures, for example as low as 625° C. Thus, Mo and $MoS_2$ have the advantage of being easily removed from said substrate coating which facilities reusing/recycling such substrate. In addition, when the aforementioned thermal annealing process is conducted under the temperature, pressure and atmospheric compositional conditions provided herein, the resulting in sensor and sensor array that are produced have a surprising and unexpected improvement in sensitivity and limit of detection. Such improvement may enable a limit of detection that is three or even five orders of magnitude greater than sensor and sensor arrays produced not using such conditions and a sensitivity that is a factor of ten greater than sensor and sensor arrays produced not using such conditions. In addition, when the aforementioned illumination patterning process is conducted under the pulse frequency, power density and said surface is contacted the aforementioned number of times, the resulting in sensor and sensor array that are produced have a surprising and unexpected improvement in the ability to manipulate of the morphology or flow of an applied drop or sample over the sensor array surface at any point in the patterning process. Thus, an improved surprising and unexpected means to guide, direct, and/or stabilize the position of a solution containing functional molecules for attachment to the sensor surface and/or a sample for analysis in a desired path along the sensor array.

Applicants disclose a process of making a sensor according to paragraph thirty-seven wherein said one or more functional molecules are biomaterials is selected from the group consisting of peptides, nanozymes, proteins, lipids, carbohydrates and lectins, nucleic acids and mixtures thereof; preferably said biomaterial is selected from the group consisting of peptides, proteins, nucleic acids and mixtures thereof; preferably a) said peptides are selected from the group consisting of assemblies of the 20 most common amino acids interacting with both target analytes and the sensor surface, and mixtures thereof. Such interactions may occur via one or a combination of the mechanisms of hydrogen bonding, Van der Waals forces, and ionic interactions between charged species. Peptides may interact with or bind to the sensor surface without modification, such as the 12-mer peptide discovered via peptide panning on the $MoS_2$ surface. Alternatively, amino acids or other molecules may be added to the peptide to promote binding to sensor surfaces or target molecules for detection, such as a peptide demonstrating enhanced interactions that may include binding to laser-processed $MoS_2$ surfaces when terminated with two Leucine amino acids. Expected trends dictating interaction strength and even binding of amino acids in peptides to surfaces, such as hydrophobicity, charge and surface contact, are not always observed in practice due to changes in conformation when bound and other factors. Peptides interacting with the sensor surface may reduce the strength and frequency of nonspecific interactions with samples containing multiple components and may also chemically stabilize the sensor surface. Peptides complementing receptor binding sites for elements of cell-surfaces, transmembrane proteins, antibodies, and enzymes provide a means of rapid, inexpensive, and stable functionalization. For example, certain peptides having are known to bind to cardiac troponin (cTnI), which is regarded as a biomarker for heart tissue damage. When the peptide is functionalized with two leucine amino acids, binds to both the laser-processed $MoS_2$ sensor surface and cTnI. Peptide binding to targets of interest may include families of peptides bearing a resemblance to binding regions of monoclonal antibodies. For medical diagnostics, peptides are known to bind to alanine aminotransferase, regarded as a biomarker for liver damage. Additional examples of peptides interacting with biological targets of interest may include the peptides detecting HIV 1 protease, the peptides for detecting trypsin, the peptides for detection of Caspase 3, and the peptides for detection of MMP-7.

b.) said nanozymes are selected from the group consisting of nanomaterials with intrinsic enzyme-like characteristics, mimicking the catalytic activity of peroxidase, oxidase, catalase, haloperoxidase, glutathione peroxidase, uricase, methane monooxygenase, hydrolase, and superoxide dismutase generally in the form of compound nanoparticles, including $Fe_3O_2$, $Mn_3O_4$, $C_{18}Fe_7N_{18}$, and mixtures thereof;

c.) said proteins are selected from the group consisting of antibodies, antibody fragments, antibody mimics, single domain antibodies, and enzymes and mixtures thereof; amino acids or other molecules may be added or subtracted from these proteins to promote interactions including binding to sensor surfaces. Amino acids or other molecules may also be attached or removed from these proteins to promote interactions between the proteins and the sensor surface such as binding, or molecules may be attached to sensor surface to promote interactions including binding. Fundamental constituents of the 5 types of antibodies may be digested into fragments to produce fragments interacting with sensor surfaces allowing maintenance of the binding region conformation for the desired effect of reducing non-specific interactions with a sample. Additionally, smaller proteins with characteristics allowing specific binding to target biomolecules, analogous to whole antibodies or antibody fragments, may be modified to interact with sensor surfaces or the sensor surfaces may modified to interact with antibodies. Proteins such as antibodies or antibody fragments interacting with the sensor surface may reduce the strength and frequency of non-specific interactions with samples containing multiple components and may also chemically stabilize the sensor surface. Such interactions may occur via one or a combination of the mechanisms of covalent bonding, hydrogen bonding, Van der Waals forces, and ionic interactions between charged species. This approach of functionalizing sensor surfaces with antibodies or antibody fragments is suitable for antibodies that bind to surface proteins on viruses (such as SARS-CoV2, and Influenza A), bacteria (such as *Streptococcus pyogenes*), and other substances such as hormones (such as human chorionic gonadotropic hormone) and proteins native to the body (e.g., cardiac troponin, cTnI) and substances foreign to the body (such as THC, narcotics). Since antibodies for each of these substances share the same fundamental structural elements for digestion into fragments and use on illumination-crystallized $MoS_2$ sensor surfaces. Enzymes are another biomolecule suitable for promotion of specific interactions. For example, the angiotensin-converting enzyme 2 (ACE2) binds to spike proteins of the SARS-CoV and SARS-CoV-2 virus. Modification of ACE2 enzyme for strengthening interactions between the enzyme and the $MoS_2$ sensor surface could involve attachment of amino acids and/or other molecules to allow binding to both sensor and target analyte. Modification could also involve removal of amino acids and molecules until a region suitable for binding to the target analyte remains.

For electronic sensing, smaller binding molecules generally lead to higher sensitivity, indicating an advantage to using smaller molecules.

d.) said lipids are selected from the group consisting of lipid bilayer arrays and liposomes and mixtures thereof including those used for support of membrane proteins for biosensing e.) said carbohydrates and lectins are selected from the group consisting of natural carbohydrates including monosaccharides, oligosaccharides, polysaccharides, or glycoconjugates with proteins and lipids including glycoproteins, glycolipids, or proteoglycans, glycosyltransferases and glycosidases and mixtures thereof; and f.) said nucleic acids are selected from the group consisting of deoxyribonucleic acid, ribonucleic acid and mixtures thereof to identify genes and genetic mutations in healthy and diseased tissue and other biomolecular targets.

Applicants disclose a process of making a sensor according to paragraphs thirty-seven through thirty-eight wherein said biomaterial's attachment to said illumination patterned and/or thermally annealed coated substrate comprises at least one of a covalent bond, electrostatic bond or a covalent and electrostatic bond. In one aspect, said at least one covalent bond comprises a disulfide bond.

Applicants disclose a process of making a sensor according to paragraphs thirty-seven through thirty-nine wherein said attaching said biomaterial's to said pattern illumination-based annealed coated substrate and/or to said thermally annealed coated substrate comprises contacting said at least a portion of said pattern illumination-based annealed coated substrate and/or at least a portion of said thermally annealed coated substrate and said one or more types of biomaterials, preferably said contacting said at least a portion of said illumination patterned and/or thermally annealed coated substrate with said one or more types of biomaterials comprises contacting said at least a portion of said illumination patterned and/or thermally annealed substrate with a solution comprising said one or more types of biomaterials, more preferably said contacting said at least a portion of said illumination patterned and/or thermally annealed coated substrate with said one or more types of biomaterials comprises contacting at least a portion of said illumination patterned and/or thermally annealed coated substrate with a solution comprising said one or more types of biomaterials via at least one of pipetting (manually or with an automated system), spraying, printing, dipping, or any other means of applying a solution to a surface. The biomaterial may be suspended in water or any suitable buffer such as phosphate buffered saline with a concentration of from about 0.0001×PBS to about 100×PBS, preferably from about 0.001×PBS-to about 20×PBS, most preferably from about 0.01×PBS to about 10×PBS, where 1×PBS is a composition of about 137 mM NaCl, 2.7 mM KCl, 10 mM $Na_2HPO_4$, and 1.8 mM $KH_2PO_4$, said water or suitable buffer may have, but is not limited to, a pH from about 6.8 to about 7.4. In order to achieve the desired concentration of one or more types of functional molecules per unit of square area on the active sensor region, a solution comprising from about 0.01 pg/mL to about 100 mg/mL of said one or more types of functional molecules may be applied to the active sensor region, preferably in order to achieve the desired concentration of one or more types of functional molecules per unit of square area on the active sensor region, a solution comprising from about 0.1 pg/mL to about 10 mg/mL of said one or more types of functional molecules may be applied to the active sensor region, more preferably in order to achieve the desired concentration of one or more types of functional molecules per unit of square area on the active sensor region, a solution comprising from about 1,000 pg/mL to about 0.1 mg/mL of said one or more types of functional molecules may be applied to the active sensor region, most preferably in order to achieve the desired concentration of one or more types of functional molecules per unit of square area on the active sensor region, a solution comprising from about 100 pg/mL about 1,000 ng/mL of said one or more types of functional molecules may be applied to the active sensor region.

Applicants disclose a process of making a sensor according to paragraphs thirty-seven through forty wherein:

a.) at least one of said one or more chemical coatings comprises two or more regions that are amorphous, nanocrystalline, microcrystalline or crystalline with the proviso that at least two of said regions are not identical with respect to being amorphous, nanocrystalline, microcrystalline or crystalline and said laser or lamp forms on, within or on and within said at least one of said one or more chemical coatings:
   (i) at least two electronic elements selected from a conductor, semiconductor and an insulator;
   (ii) two or more different conductors having at least one of the following: different electrical properties or different optical properties;
   (iii) two or more different semiconductors having at least one of the following: different electrical properties or different optical properties; or
   (iv) two or more different insulators having at least one of the following: different electrical properties or different optical properties;

said illumination patterned and/or thermally annealing resulting in at least a structural change, an optional chemical change, and the removal of at least a portion of at least one of said one or more chemical coatings and resulting in an electrical component, an optical component or a combined electrical and optical component being formed on, within or on and within at least a portion of said illumination patterned and/or thermally annealed one or more chemical coatings; or b) at least one of said one or more chemical coatings comprises at least one region that is amorphous, nanocrystalline, microcrystalline or crystalline, and said one or more lasers and/or lamps forms on, within or on and within said at least one of said one or more chemical coatings:
   (i) at least two electronic elements selected from a conductor, semiconductor and an insulator;
   (ii) two or more different conductors having at least one of the following: different electrical properties or different optical properties;
   (iii) two or more different semiconductors having at least one of the following: different electrical properties or different optical properties; or
   (iv) two or more different insulators having at least one of the following: different electrical properties or different optical properties;

c) then repeating, one or more times said illumination patterned and/or thermally annealing on said portion of said one or more chemical coatings using one or more of the following:
   (i) the same device but at least one of the following: a different intensity or time;
   (ii) a different environmental condition from the previous environmental condition, said different environmental condition select from the same group of environmental conditions; or
   (iii) a lamp if the previous illumination-patterning was laser illumination-patterning or a laser if the previous illumination-patterning was lamp illumination-patterning said illumination patterning and/or thermally annealing resulting in at least a structural change, an optional chemical change, and the removal of at least a portion of at least one of said one or more chemical coatings and resulting in an electrical component, an optical component or a combined electrical and optical component being formed on, within or on and within at least a portion of said illumination patterned and/or thermally annealed one or more chemical coatings.

Applicants disclose a process of making a sensor according to paragraph forty-one wherein for element b) said at least one chemical coating comprises two or more regions that are amorphous, nanocrystalline, microcrystalline or crystalline with the proviso that at least two of said regions are not identical with respect being amorphous, nanocrystalline, microcrystalline or crystalline, at least two of said regions being illumination patterned and/or thermally annealed via different illumination patterned and thermally annealing processes.

Applicants disclose a process of making a sensor according to paragraphs thirty-seven through forty-two wherein said transition metal is selected from the group consisting of molybdenum, tungsten, niobium, tantalum, vanadium, titanium, chromium, iron, rhodium, hafnium, rhenium and mixtures thereof.

Applicants disclose a process of making a sensor according to paragraphs thirty-seven through forty-three wherein said material comprises at least one region that is amorphous or nanocrystalline.

Applicants disclose a process of making a sensor according to paragraphs thirty-seven through forty-four wherein said illumination patterning is achieved by using one or more lasers, said one or more lasers each being independently selected from a laser that is a pulsed laser, a continuous laser or a pulsed/continuous laser. A pulsed/continuous laser is a laser that can provide a pulsed laser beam and a continuous laser.

Applicants disclose a process of making a sensor according to paragraphs thirty-seven through forty-five wherein said illumination patterning is achieved by using a continuous wave laser to subject at least a portion of said chemical coating to said continuous laser, preferably said portion of said chemical coating has an area of about 100 square nanometers to about 1 square meter, more preferably said portion of said chemical coating has an area of about 1 square micrometer to about 1 $cm^2$, most preferably said portion of said chemical coating has an area of about 100 square micrometers to about 250,000 square micrometers. Said portion of said chemical coating maybe of any geometry including but not limited to a rectangular, circular or square.

Applicants disclose a process of making a sensor according to paragraphs thirty-seven through forty-five wherein said illumination patterning is achieved by using a lamp to subject at least a portion of said chemical coating to said lamp, preferably said portion of said chemical coating has an area of about 1 square micrometer to about 50 square meters, more preferably said portion has an area of about 1 square micrometers to about 1 square meter, most preferably said portion of said chemical coating has an area of about 10 square micrometers to about 1 $cm^2$. Said portion of said chemical coating maybe of any geometry including but not limited to a rectangular, circular or square.

Applicants disclose a process of making a sensor according to paragraphs thirty-seven through forty-five wherein said illumination patterning is achieved by using a pulsed laser to subject at least a portion of said chemical coating to said pulsed laser; preferably said portion of said chemical coating has an area of about 100 square nanometers to about 1 square meter, more preferably said portion of said chemical coating has an area of about 1 square micrometers to about 1 $cm^2$, most preferably said portion of said chemical coating has an area of about 100 square micrometers to about 500 square micrometers. Said portion of said chemical coating maybe of any geometry including but not limited to a rectangular, circular or square.

Applicants disclose a process of making a sensor according to paragraphs thirty-seven through forty-eight wherein, said each chemical coating independently has a thickness of from about 0.1 nanometers to about 1 centimeter.

Applicants disclose a process of making a sensor according to paragraphs thirty-seven through forty-nine wherein, said each chemical coating independently has a thickness of from about 0.3 nanometers to about 10 micrometers.

Applicants disclose a process of making a sensor according to paragraphs thirty-seven through fifty wherein, said electrical and/or optical component is selected from the group consisting of an inductor, a capacitor, a resistor, a diode, a transistor, a trace, a battery, an optical filter, a chemical sensor, a biological sensor and a solar cell.

Applicants disclose a process of making a sensor according to paragraphs thirty-seven through fifty-one wherein each of said one or more chemical coatings have an area and a thickness and said removal of said at least a portion of said one or more chemical coating occurs, said removal comprising at least one of:

a.) laser ablation removal of from about 0.1% to about 99.9% of at least one of said one or more chemical coatings' area, preferably said removal comprising laser ablation removal of from about 2% to about 98% of at least one of said chemical coatings' area, more preferably said removal comprising laser ablation removal of from about 10% to about 90% of at least one of said chemical coatings' area; or b.) laser ablation removal of at least 85% of at least one of said chemical coatings' thickness, preferably said removal comprises laser ablation removal of at least 95% of at least one of said chemical coatings' thickness; or laser ablation removal of about 85% to about 99% of at least one of said chemical coatings' thickness.

Applicants disclose a process of making a sensor according to paragraphs thirty-seven through fifty-two wherein said substrate of said coated substrate is selected from glass, polymer and mixtures thereof, preferably said polymer is selected from the group consisting of polyethylene naphthalate, polyimide, polycarbonate, polyethylene naphthalate and polyethylene terephthalate and mixtures thereof.

Applicants disclose a process of making a sensor according to paragraphs thirty-seven through fifty-three wherein at least a portion of said coated substrate's illumination patterned and thermally annealed chemical coating is further treated by at least one of the following processes:

a.) one or more additional illumination patterning and thermally annealings; said one or more additional illumination patterning and thermally annealings may each be independently conducted in accordance with the process disclosed in paragraphs thirty-eight through fifty-three;

b.) plasma treatment comprising exposing said at least a portion of said coated substrate's illumination patterned and thermally annealed chemical coating to an ionized gas derived from the group consisting of He, Ne, Ar, Kr, Xe, $H_2$, $O_2$, $SF_6$, $CF_4$, $N_2$ and mixtures thereof preferably said plasma treatment comprises exposing said at least a portion of said coated substrate's illumination patterned and thermally annealed chemical coating to an ionized gas derived from the group consisting of He, Ar, $H_2$, $O_2$, $SF_6$, $CF_4$ and mixtures thereof, more preferably said plasma treatment comprises exposing said at least a portion of said coated substrate's illumination patterned and thermally annealed chemical coating to an ionized gas derived from the group consisting of Ar, $H_2$, $SF_6$, $CF_4$ and mixtures thereof, most preferably said plasma treatment comprises exposing said at least a portion of said coated substrate's illumination patterned and thermally annealed chemical coating to an ionized gas derived from the group consisting of Ar, $H_2$ and mixtures thereof;

(i) said plasma treatment being conducted at a pressure of from about 0.1 mTorr to about 1000 Torr, preferably said plasma treatment being conducted at a pressure of about 0.5 mTorr to about 760 Torr, more preferably said plasma treatment being conducted at a pressure of about 1 mTorr to about 100 Torr, most preferably said plasma treatment being conducted at a pressure of about 1 mTorr to about 10 Torr;

(ii) said at least a portion of said coated substrate's illumination patterned and thermally annealed chemical coating's plasma treatment temperature being from about 0° C. to about 1,500° C., preferably said at least a portion of said coated substrate's illumination patterned and thermally annealed chemical coating's plasma treatment temperature being from about 5° C. to about 1,000° C., more preferably said at least a portion of said coated substrate's illumination patterned and thermally annealed chemical coating's plasma treatment temperature being from about 5° C. to about 900° C., most preferably said at least a portion of said coated substrate's illumination patterned and thermally annealed chemical coating's plasma treatment temperature being from about 18° C. to about 700° C.; and (iii) said at least a portion of said coated substrate's illumination patterned and thermally annealed chemical coating exposure time being from about 0.001 seconds to about 10,000,000 seconds, preferably said at least a portion of said coated substrate's illumination patterned and thermally annealed chemical coating exposure time being from about 0.01 seconds to about 1,000,000 seconds, more preferably said at least a portion of said coated substrate's illumination patterned and thermally annealed chemical coating exposure time being from about 0.1 seconds to about 100,000 seconds, most preferably said at least a portion of said coated substrate's illumination patterned and thermally annealed coating exposure time being from about 0.1 seconds to about 10,000 seconds. Different modes of plasma generation may include remote plasmas from sources such as electron cyclotron resonance, inductively coupled plasmas, capacitively coupled plasmas, and electron beam generated plasmas. Inductively coupled and glow discharge plasmas by coupling of power to the substrate may also be used alone or in conjunction with a remote plasma source. Plasma power may be continuous or pulsed from frequencies ranging from 0.01 Hz to 10 GHz. The.

c.) ion beam irradiation comprising exposing said at least a portion of said coated substrate's illumination patterned and thermally annealed chemical coating to an ion beam, said ion beam comprising an ionized gas derived from the group consisting of He, Ne, Ar, Kr, Xe, $H_2$, $O_2$, $SF_6$, $CF_4$, $N_2$ and mixtures thereof; preferably said ion beam comprises an ionized gas derived from the group consisting of He, Ar, $H_2$, $O_2$, $SF_6$, $CF_4$ and mixtures thereof, more preferably said ion beam comprising an ionized gas derived from the group consisting of Ar, $H_2$, $SF_6$, $CF_4$ and mixtures thereof, most preferably said ion beam comprising an ionized gas derived from the group consisting of Ar, $H_2$ and mixtures thereof;

(i) said ion beam having an incident ion energy of from about 50 eV to about 10,000 eV, preferably said ion beam having an incident ion energy of from about 100 eV to about 5,000 eV, more preferably said ion beam having an incident ion energy of from about 100 eV to 2000 eV, most preferably said ion beam having an incident ion energy of from about 100 eV to 1000 eV;

(ii) said ion beam having an incoming ion species incident angle of from about 1° to 90°, relative to the surface being bombarded, preferably said ion beam having an incoming ion species incident angle of from about 3° to about 90°, more preferably said ion beam having an incoming ion species incident angle of from about 4° to about 90°, and most preferably said ion beam having an incoming ion species incident angle of from about 5° to about 90°;

(iii) said ion beam having an incident ion flux of from about 0.1 $nA/mm^2$ to about 900,000,000 $nA/mm^2$, preferably said ion beam having an incident ion flux of from about 0.5 $nA/mm^2$ to about 10,000,000 $nA/mm^2$, more preferably said ion beam having an incident ion flux of from about 0.5 to about 1,000,000 $nA/mm^2$, and most preferably said ion beam having an incident ion flux of from about 0.5 to about 900,000 $nA/mm^2$;

(iv) said at least a portion of said coated substrate's illumination patterned and thermally annealed chemical coating's ion beam irradiation treatment temperature being from about 0° C. to about 1,500° C., preferably said at least a portion of said coated substrate's illumination patterned and thermally annealed chemical coating's ion beam irradiation treatment temperature being from about 5° C. to about 1,000° C., more preferably said at least a portion of said coated substrate's illumination patterned and thermally annealed chemical coating's ion beam irradiation treatment temperature being from about 5° C. to about 900° C., most preferably said at least a portion of said coated substrate's illumination patterned and thermally annealed chemical coating's ion beam irradiation treatment temperature being from about 18° C. to about 700° C.; and (v) said at least a portion of said coated substrate's illumination patterned and thermally annealed chemical coating's ion beam irradiation exposure time to said ion beam being from about 0.001 seconds to about 10,000,000 seconds, preferably said at least a portion of said coated substrate's illumination patterned and thermally annealed chemical coating's ion beam irradiation exposure time to said ion beam being from about 0.01 seconds to about 1,000,000 seconds, more preferably said at least a portion of said coated substrate's illumination patterned and thermally annealed chemical coating's ion beam irradiation exposure time to said ion beam being from about 0.1 seconds to about 100,000 seconds, most preferably at least a portion of said coated substrate's illumination patterned and thermally annealed chemical coating's ion beam irradiation exposure time to said ion beam being from about 0.1 seconds to about 10,000 seconds; Sensor surface is a means to generate sulfur vacancies d.) electron beam illumination comprising at least a portion of said coated substrate's illumination patterned and thermally annealed chemical coating to an electron dose of from about $10^2$ $electrons/nm^2$ to about $10^{25}$ $electrons/nm^2$, preferably from about $10^3$ $electrons/nm^2$ to about $10^{22}$ $electrons/nm^2$, more preferably from about $10^4$ $electrons/nm^2$ to about $10^{20}$ $electrons/nm^2$, most preferably from about $10^5$ $electrons/nm^2$ to about $10^{18}$ $electrons/nm^2$ by exposing said at least a portion of said coated substrate's illumination patterned and thermally annealed chemical coating to:

(i) to an electron beam having an incident electron energy of from about 0.1 eV to about 100,000,000 eV, preferably said electron beam having an incident electron energy of from about 1 eV to about 10,000,000 eV, more preferably said electron beam having an incident electron energy of from about 1 eV to about 1,000,000 eV, most preferably said electron beam having an incident electron energy of from about 1 eV to about 500,000 eV;

(ii) said at least a portion of said coated substrate's illumination patterned and thermally annealed chemical coating's electron beam illumination exposure time to said electron beam illumination being from about 0.001 seconds to about 10,000,000 seconds, preferably said at least a portion of said coated substrate's illumination patterned and thermally annealed chemical coating's electron beam illumination exposure time to said electron beam illumination being from about 0.01 seconds to about 1,000,000 seconds, more preferably said at least a portion of said coated substrate's illumination patterned and thermally annealed chemical coating's electron beam illumination exposure time to said electron beam illumination being from about 0.1 seconds to about 100,000 seconds, most preferably at least a portion of said coated substrate's illumination patterned and thermally annealed chemical coating's electron beam illumination exposure time to said electron beam illumination being from about 0.1 seconds to about 10,000 seconds;

(iii) said at least a portion of said coated substrate's illumination patterned and thermally annealed chemical coating's electron beam illumination treatment temperature being from about 0° C. to about 1,500° C., preferably said at least a portion of said coated substrate's illumination patterned and thermally annealed chemical coating's electron beam illumination treatment temperature being from about 5° C. to about 1,000° C., more preferably said at least a portion of said coated substrate's illumination patterned and thermally annealed chemical coating's electron beam illumination treatment temperature being from about 5° C. to about 900° C., most preferably said at least a portion of said coated substrate's illumination patterned and thermally annealed chemical coating's electron beam illumination treatment temperature being from about 18° C. to about 700° C.; Electron beam illumination is a means of inducing surface changes on said at least a portion of said coated substrate's pattern illumination-based annealed chemical coating. Such changes improve and/or control sites for physical and/or chemical bonding.

e.) thermal annealing said at least a portion of said coated substrate's pattern illumination-based annealed chemical coating, said at least a portion of said coated substrate's pattern illumination-based annealed chemical coating's thermal annealing treatment temperature being from about 0° C. to about 1,500° C.;

f.) chemically etching said at least a portion of said coated substrate's illumination patterned and thermally annealed chemical coating comprising contacting said at least a portion of said coated substrate's illumination patterned and thermally annealed chemical coating with an etching composition, preferably said coated substrate's illumination patterned and thermally annealed chemical coating is treated in accordance with at least one of the process of Paragraph fifty a) or Paragraph fifty b) prior to said contact with said etching composition, preferably said etching composition is a solution, gel or paste, more preferably said etching composition is a solution having an etching concentration of from about 0.00003 mol/L to about 30 mol/L, more preferably said etching composition is a solution having an etching concentration of from about 0.0003 mol/L to about 25 mol/L, more preferably said etching composition is a solution having an etching concentration of from about 0.003 mol/L to about 20 mol/L, most preferably said etching composition is a solution having an etching concentration of from about 0.03 mol/L to about 20 mol/L; said contacting occurring for a time of from about 0.001 seconds to about 10,000,000 seconds, preferably said contacting occurring for a time of from about 0.01 seconds to about 1,000,000 seconds, more preferably said contacting occurring for a time of from about 0.1 seconds to about 100,000 seconds, and most preferably said contacting occurring for a time of from about 0.1 seconds to about 10,000 seconds, said etching composition having a temperature over said contacting time of from about 0° C. to about 200° C., preferably said etching composition having a temperature over said contacting time of from about 5-180° C., more preferably said etching composition having a temperature over said contacting time of from about 10° C. to about 150° C., most preferably said etching composition having a temperature over said contacting time of from about 18° C. to about 100° C. While not being bound by theory, Applicants believe that sulfur and/or selenium vacancies in $MoS_2$ are produced via chemical modification by etching $MoS_2$ in a solution such as sodium hypochlorite (NaClO) solution as provided above.

g.) electro-chemically treating said at least a portion of said coated substrate's illumination patterned and thermally annealed chemical coating by contacting said at least a portion of said coated substrate's pattern illumination patterned and thermally annealed chemical coating with a chemical composition comprising an electrolyte and subjecting said contacted at least a portion of said coated substrate's illumination patterned and thermally annealed chemical coating and said chemical composition comprising an electrolyte to an electrical current, preferably at least a portion of said coated substrate's illumination patterned and thermally annealed chemical coating is subjected to said electrical current for a time of from about 0.01 seconds to about 60,000 seconds, more preferably at least a portion of said coated substrate's illumination patterned and thermally annealed chemical coating is subjected to said electrical current for a time of from about 0.1 seconds to about 6,000 seconds, more preferably at least a portion of said coated substrate's illumination patterned and thermally annealed chemical coating is subjected to said electrical current for a time of from about 1 seconds to about 600 seconds, most preferably at least a portion of said coated substrate's illumination patterned and thermally annealed chemical coating is subjected to said electrical current for a time of from about 10 seconds to about 60 seconds, preferably said at least a portion of said coated substrate's illumination patterned and thermally annealed chemical coating's temperature is from about 0° C. to about 200° C. during said time, preferably said at least a portion of said coated substrate's illumination patterned and thermally annealed coating's temperature is from about 5° C. to about 180° C. during said time, more preferably said at least a portion of said coated substrate's illumination patterned and thermally annealed chemical coating's temperature is from about 10° C. to about 150° C. during said time, most preferably said at least a portion of said coated substrate's illumination patterned and thermally annealed chemical coating's temperature is from about 18° C. to about 100° C. during said time, preferably said electrolyte's concentration is from about 0.0005M to about 50 M, more preferably said electrolyte's concentration is from about 0.005M to about 25M, more preferably said electrolyte's concentration is from about 0.05M to about 20M, most preferably said electrolyte's concentration is from about 0.5M to about 10M, preferably said electrical current has a linear sweep voltammetry sweeping speed of from about 0.001 mV $s^{-1}$ to about 500 mV $s^{-1}$, more preferably said electrical current has a linear sweep voltammetry sweeping speed of from about 0.01 mV $s^{-1}$ to about 250 mV $s^{-1}$, more preferably said electrical current has a linear sweep voltammetry sweeping speed of from about 0.1 mV $s^{-1}$ to about 200 mV $s^{-1}$, most preferably said electrical current has a linear sweep voltammetry sweeping speed of from about 1 mV $s^{-1}$ to about 200 mV $s^{-1}$. For example, the desulfurization of multilayer $MoS_2$ samples is achieved by electrochemical desulfurization conducted in an electrochemical cell with 0.5 M sulfuric acid ($H_2SO_4$);

h.) surface physical modification of at least a portion of said coated substrate's pattern illumination-based annealed chemical coating including but not limited to ball milling or polishing.

Applicants disclose a process of making a sensor according to paragraphs thirty-seven through fifty-four wherein each target is independently a chemical target or a biological target.

Sensor Comprising Pattern Illumination-Based Annealed and/or Thermally Annealed Coated Substrate and One or More Functional Molecules and Method of Use For purposes of this specification, headings are not considered paragraphs and thus this paragraph is paragraph fifty-six of the present specification. The individual number of each paragraph above and below this paragraph can be determined by reference to this paragraph's number. In this paragraph fifty-six, Applicants disclose a sensor comprising an illumination patterned and thermally annealed, coated substrate comprising a substrate having a first side and a second side and one or more types of functional molecules and/or one or more complexes comprising one or more types of functional molecules and one or more target molecules attached to at least a portion of said illumination patterned and thermally annealed coated substrate, a.) said substrate's first side comprising;

(i) one or more coatings of patterned electrical conductive material disposed over said substrate's first side, preferably said patterned electrical conductive material comprises a material selected from the group consisting of poly(3,4-ethylenedioxythiophene), poly(3,4-ethylenedioxythiophene) polystyrene sulfonate, poly(pyrrole), polycarbazoles, polyindoles, polyazepines, Cr, Mo, Ti, Sc, Ni, V, Hf, W, Nb, Au, Ag, Cu, and Pt and mixtures thereof; more preferably said patterned electrical conductive material comprises a metal selected from the group consisting of Cr, Mo, Ti, Sc, Ni, V, Hf, W, Nb, Au, Ag, Cu, and Pt and mixtures thereof, most preferably said metal comprises a metal selected from the group consisting of Mo, Cr, Ti, Au and mixtures thereof, most preferably said one or more coatings of patterned electrical conductive material is a coating of Mo, a coating of Cr and a second coating of Au over said coating of Cr or a coating of Ti and a second coating of Au over said coating of Ti; and (ii) one or more chemical coatings disposed over said one or more coatings of patterned electrically conductive material, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$, and mixtures thereof, at least a portion of said one or more chemical coatings being a illumination patterned and thermally annealed chemical coating;

b.) said substrate's second side optionally comprising:

(i) one or more coatings of patterned electrical conductive material disposed over said substrate's first side, preferably said patterned electrical conductive material comprises a material selected from the group consisting of poly(3,4-ethylenedioxythiophene), poly(3,4-ethylenedioxythiophene) polystyrene sulfonate, poly(pyrrole), polycarbazoles, polyindoles, polyazepines, Cr, Mo, Ti, Sc, Ni, V, Hf, W, Nb, Au, Ag, Cu, and Pt and mixtures thereof; more preferably said patterned electrical conductive material comprises a metal selected from the group consisting of Cr, Mo, Ti, Sc, Ni, V, Hf, W, Nb, Au, Ag, Cu, and Pt and mixtures thereof, most preferably said metal comprises a metal selected from the group consisting of Mo, Cr, Ti, Au and mixtures thereof, most preferably said one or more coatings of patterned electrical conductive material is a coating of Mo, a coating of Cr and a second coating of Au over said coating of Cr or a coating of Ti and a second coating of Au over said coating of Ti; and (ii) one or more chemical coatings disposed over said one or more coatings of patterned electrical conductive material, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$ and mixtures thereof, at least a portion of said optional one or more chemical coatings being a illumination patterned and thermally annealed chemical coating. As used herein target molecules can be simple molecules or macromolecules including but not limited to proteins, lipids, and carbohydrates, target molecules include aromatics, aromatic halogens, halocarbon, polar aprotics, volatile organic compounds, hazardous gases, for example, arsenic, radon, nitrogen dioxide, carbon monoxide, carbon dioxide, carbon disulfide, ammonia, napthalene, isoprene, terpenes, methanol, benzyl chloride, hexachloro-1,3-butadiene, tribomomethane, 1,4-dioxane.

Applicants disclose a sensor according to paragraph fifty-six comprising at least one of:

a.) at least one chemical coating comprising two or more regions that are amorphous, nanocrystalline, microcrystalline or crystalline with the proviso that at least two of said regions are not identical with respect being amorphous, nanocrystalline, microcrystalline or crystalline, at least two of said regions being illumination patterned and thermally annealed via different illumination patterning and thermally annealing processes; or b.) at least one chemical coating comprising at least one region that is amorphous, nanocrystalline, microcrystalline or crystalline said at least one region being illumination patterned and thermally annealed two or more times. The sensor of paragraphs fifty-eight and fifty-nine could be produced in accordance with the processes of paragraphs thirty-seven through fifty-seven.

Applicants disclose a sensor according to paragraphs fifty-six through fifty-seven wherein:

a.) said substrate of said coated substrate is selected from glass, polymer and mixtures thereof, preferably said polymer is selected from the group consisting of polyethylene naphthalate, polyimide, polycarbonate, polyethylene naphthalate and mixtures thereof;

b) said one or more coatings of patterned electrical conductive material is a coating of Mo, a coating of Cr and a second coating of Au over said coating of Cr or a coating of Ti and a second coating of Au over said coating of Ti; and c) said one or more chemical coatings comprises a material selected from the group consisting of $MoS_2$, $WS_2$, $MoSe_2$, $WSe_2$ and mixtures thereof.

Applicants disclose a sensor according to paragraphs fifty-six through fifty-seven wherein said one or more functional molecules are biomaterials selected from the group consisting of peptides, nanozymes, proteins, lipids, carbohydrates and lectins, nucleic acids and mixtures thereof; preferably said biomaterial is selected from the group consisting of peptides, proteins, nucleic acids and mixtures thereof; preferably a) said peptides are selected from the group consisting of assemblies of the 20 most common amino acids interacting with both target analytes and the sensor surface, and mixtures thereof. Such interactions may occur via one or a combination of the mechanisms of hydrogen bonding, Van der Waals forces, and ionic interactions between charged species. Peptides may interact with or bind to the sensor surface without modification, such as the 12-mer peptide discovered via peptide panning on the $MoS_2$ surface. Alternatively, amino acids or other molecules may be added to the peptide to promote binding to sensor surfaces or target molecules for detection, such as any peptide demonstrating enhanced interactions that may include binding to laser-processed $MoS_2$ surfaces when terminated with two Leucine amino acids. Expected trends dictating interaction strength and even binding of amino acids in peptides to surfaces, such as hydrophobicity, charge and surface contact, are not always observed in practice due to changes in conformation when bound and other factors. Peptides interacting with the sensor surface may reduce the strength and frequency of nonspecific interactions with samples containing multiple components and may also chemically stabilize the sensor surface. Peptides complementing receptor binding sites for elements of cell-surfaces, transmembrane proteins, antibodies, and enzymes provide a means of rapid, inexpensive, and stable functionalization. For example, the peptides are known to bind to cardiac troponin (cTnI), which is regarded as a biomarker for heart tissue damage. When the peptide is functionalized with two leucine amino acids, binds to both the laser-processed $MoS_2$ sensor surface and cTnI. Peptide binding to targets of interest may include families of peptides bearing a resemblance to binding regions of monoclonal antibodies. For medical diagnostics, peptide are known to bind to alanine aminotransferase, regarded as a biomarker for liver damage. Additional examples of peptides interacting with biological targets of interest may include the peptides for detecting HIV 1 protease, the peptides for detecting trypsin, the peptides for detection of Caspase 3, and the peptides for detection of MMP-7.

b.) said nanozymes are selected from the group consisting of nanomaterials with intrinsic enzyme-like characteristics, mimicking the catalytic activity of peroxidase, oxidase, catalase, haloperoxidase, glutathione peroxidase, uricase, methane monooxygenase, hydrolase, and superoxide dismutasegenerally in the form of compound nanoparticles, including $Fe_3O_2$, $Mn_3O_4$, $C_{18}Fe_7N_{18}$, and mixtures thereof;

c.) said proteins are selected from the group consisting of antibodies, antibody fragments, antibody mimics, single domain antibodies, and enzymes and mixtures thereof; amino acids or other molecules may be added or subtracted from these proteins to promote interactions including binding to sensor surfaces. Amino acids or other molecules may also be attached or removed from these proteins to promote interactions between the proteins and the sensor surface such as binding, or molecules may be attached to sensor surface to promote interactions including binding. Fundamental constituents of the 5 types of antibodies may be digested into fragments to produce fragments interacting with sensor surfaces allowing maintenance of the binding region conformation for the desired effect of reducing non-specific interactions with a sample. Additionally, smaller proteins with characteristics allowing specific binding to target biomolecules, analogous to whole antibodies or antibody fragments, may be modified to interact with sensor surfaces or the sensor surfaces may be modified to interact with antibodies. Proteins such as antibodies or antibody fragments interacting with the sensor surface may reduce the strength and frequency of non-specific interactions with samples containing multiple components and may also chemically stabilize the sensor surface. Such interactions may occur via one or a combination of the mechanisms of covalent bonding, hydrogen bonding, Van der Waals forces, and ionic interactions between charged species. This approach of functionalizing sensor surfaces with antibodies or antibody fragments is suitable for antibodies that bind to surface proteins on viruses (such as SARS-CoV2, and Influenza A), bacteria (such as *Streptococcus pyogenes*), and other substances such as hormones (such as human chorionic gonadotropic hormone) and proteins native to the body (e.g., cardiac troponin, cTnI) and substances foreign to the body (such as THC, narcotics). Since antibodies for each of these substances share the same fundamental structural elements for digestion into fragments and use on illumination-crystallized $MoS_2$ sensor surfaces. Enzymes are another biomolecule suitable for promotion of specific interactions. For example, the angiotensin-converting enzyme 2 (ACE2) binds to spike proteins of the SARS-CoV and SARS-CoV-2 virus. Modification of ACE2 enzyme for strengthening interactions between the enzyme and the $MoS_2$ sensor surface could involve attachment of amino acids and/or other molecules to allow binding to both sensor and target analyte. Modification could also involve removal of amino acids and molecules until a region suitable for binding to the target analyte remains. For electronic sensing, smaller binding molecules generally lead to higher sensitivity, indicating an advantage to using smaller molecules.

d.) said lipids are selected from the group consisting of lipid bilayer arrays and liposomes and mixtures thereof including those used for support of membrane proteins for biosensing e.) said carbohydrates and lectins are selected from the group consisting of natural carbohydrates including monosaccharides, oligosaccharides, polysaccharides, or glycoconjugates with proteins and lipids including glycoproteins, glycolipids, or proteoglycans, glycosyltransferases and glycosidases and mixtures thereof and)

f.) said nucleic acids are selected from the group consisting of deoxyribonucleic acid, ribonucleic acid and mixtures thereof to identify genes and genetic mutations in healthy and diseased tissue and other biomolecular targets.

Applicants disclose a sensor according to paragraphs fifty-six through fifty-nine wherein said one or more functional molecules' attachment to said illumination patterned and thermally annealed coated substrate comprises at least one of a covalent bond, electrostatic bond or a covalent and electrostatic bond. In one aspect, said at least one covalent bond comprises a disulfide bond.

Applicants disclose a sensor according to paragraphs fifty-six through sixty wherein said one or more functional molecule's concentration on said illumination patterned and thermally annealed coated substrate is from about 0.001 nanograms per square centimeter to about 1,000 nanograms per square centimeter, preferably said one or more functional molecule's concentration on said illumination patterned and thermally annealed coated substrate is from about 0.01 nanograms per square centimeter to about 500 nanograms per square centimeter, more preferably said one or more functional molecule's concentration on said illumination patterned and thermally annealed coated substrate is from about 0.1 nanograms per square centimeter to about 200 nanograms per square centimeter, most preferably said one or more functional molecule's concentration on said illumination patterned and thermally annealed coated substrate is from about 0.1 nanograms per square centimeter to about 100 nanograms per square centimeter. The preferred concentration of biomaterial may depend on the geometry and desired sensitivity limit of the sensor device. For example, a smaller sensor geometry can be used to reduce the number of interactions with a species in the applied sample over a given time period to be reduced.

Applicants disclose a sensor according to paragraphs fifty-six through sixty-one having a sensitivity of from about $5\times10^{-5}$% change in resistance per second to about $5\times10^{-1}$% change in resistance per second and a limit of detection of from about 0.01 fg/ml to about 10 micrograms/ml; in one aspect said sensor has a sensitivity of from about $1\times10^{-4}$% change in resistance per second to about $1\times10^{-1}$% change in resistance per second and a limit of detection of from about 0.1 fg/ml to about 1 micrograms/ml; in one aspect said sensor has a sensitivity of from about $5\times10^{-4}$% change in resistance per second to about $5\times10^{-2}$% change in resistance per second and a limit of detection of from about 1 fg/ml to about 0.1 micrograms/ml.

Applicants disclose a sensor array comprising one or more sensors according to paragraphs fifty-six through sixty-two.

Applicants disclose a method of using a sensor according to paragraphs fifty-six through sixty-three or a sensor array according to paragraph sixty-five comprising the steps of:

a.) measuring one or more optical and/or electrical properties of a sensor according to paragraphs fifty-six through sixty-one after said sensor comprises one or more complexes comprising one or more types of functional molecules and one or more target molecules b.) comparing said one or more optical and/or electrical properties of said sensor to a baseline of said sensor measured before said sensor comprises one or more complexes comprising one or more types of functional molecules and one or more target molecules. The response of the sensor to a biological sample may be measured electrically or optically, or both electrically and optically. Sensor responses indicating presence of a target species may include changes in electrical resistance in a chemresistor configuration, changes in current flow for a transistor configuration, changes in refractive index, changes in photoluminescence intensity or frequency, and other electrical, optical, or combined electrical and optical responses. After testing, the sample can be neutralized, disposed of, recycled, regenerated, and/or reused. The complexes comprising said one or more types of functional molecules and one or more target molecules can from in a time from about 0.001 seconds to about 5,000,000 seconds, preferably the complexes comprising said one or more types of functional molecules and one or more target molecules can from in a time from about 0.1 seconds to about 5,000 seconds; and more preferably the complexes comprising said one or more types of functional molecules and one or more target molecules can from in a time from about 0.1 seconds to about 1,000 seconds.

Suitable amorphous, nanocrystalline, microcrystalline and/or crystalline materials comprising a transition metal and hydrogen, carbon, nitrogen, oxygen, sulfur, selenium, tellurium, and/or phosphorous can be obtained from Plasmaterials (2268 Research Drive, Livermore, CA 94550 USA) and Kurt Lesker (1925 Route 51, Jefferson Hills, PA 15025 USA.

Patterned metal on silicon or glass wafers can be obtained from Sil'tronix (382 rue Louis Rustin, Technopole d'Archamps, 74160 Archamps, France) or University Wafer (11 Elkins Street, Unit 330, South Boston, MA 02127). Patterned metal on polymer substrates, including polyimide, polycarbonate, polyethylene naphthalate and polyethylene terephthalate may be obtained from VAST Films LTD (13525 Youngstown-Pittsburgh Rd, Petersburg, OH 44454). Peptides may be obtained from Genscript Corporation (860 Centennial Ave. Piscataway, NJ 08854, USA). Antibodies and antibody fragments may be obtained from Virusys Corporation (6370 Keysville Road, Keymar, MD 21757. Single-domain antibodies may be obtained from NanoTag Biotechnologies (Rudolf-Wissell-StraBe 28a, 37079 Gottingen, Germany). Nanoparticles functioning as nanozymes can be obtained millipore sigma (400 Summit Drive Burlington, MA 01803). Lipids and kits for making liposomes are also available from millipore sigma.

Suitable continuous wave lasers for conducting Applicants can be obtained from Thorlabs (56 Sparta Avenue, Newtown, NJ 07860 USA), Coherent (5100 Patrick Henry Dr., Santa Clara, CA 95054 USA), and TLM Laser Ltd (Navigation Court, Harris Business Park, Stoke Prior, Bromsgrove, Worcestershire, B60 4FD UK). Pulsed lasers suitable for the applications described here include the Keyence MDX series of laser models obtained from Keyence Corporation (720 South Colorado Boulevard, Suite 650-S Denver, CO 80246A) which is capable of a selected range of pulse lengths between microseconds to milliseconds. Lasers with femtosecond and picosecond pulse widths suitable for the applications described here are available from Control Micro Systems (CMS) Laser (4420-A Metric Drive Winter Park, Flor. 32792). Lamps with characteristics suitable for the applications described here include the Pulse Forge 3300 model by manufactured by Novacentrix (400 Parker Dr. Suite 1110, Austin, TX). Suitable Raman spectrometer detectors can be acquired for Renishaw (764 McEwen Rd., Dayton, OH 45459 USA). Suitable optical detectors can be acquired from Horiba. Scientific (1002 Harvest Ct., Coraopolis, PA 15108).

Test Method

Test Method to Determine Limit of Detection and Sensitivity

Step 1: Measure a baseline resistance of the as-fabricated sensor having dimensions of 250 microns by 85 microns or sensor array having sensors having dimensions of 250 microns by 85 microns in increments of time between 0.001 and 10 seconds between measurements. Establish a value for baseline resistance by averaging a suitable number of measurements of this as-fabricated resistance for statistical significance.

Step 2: Apply a 1 microliter volume of sample to make contact with the surface of the sensor or each sensor in said sensor array transducer(s) while electrical resistance is measured. Record the measured values in increments of 0.001 to 10 seconds during the test.

Step 3: When data has been acquired for the desired time, the resistance measurement is terminated and the data are saved.

Step 4: The data is processed by normalizing the instantaneous resistance at any given time for a sensor device during the test to the initial, as-fabricated sensor or sensor array resistance value. This data is the data used to calculate the response curve in Step 7 below.

Step 5: The average resistance values and standard deviation values for a series of individual sensor measurements can be calculated for a negative control sample and a series of positive samples at incremental concentrations over the dynamic range of the sensor or sensor array.

Step 6: To determine the limit of detection of the sensor device, the positive sample concentration yielding a change in average resistance normalized as described in Step 4 with a value >3 times the standard deviation of average for a statistically significant number of negative control samples may be considered the limit of detection.

Step 7. To determine sensitivity of a sensor or sensor array the slope of the response curve is calculated using the data from Step 4 wherein the slope is the change in resistance over time representing the dynamic range of the sensor or sensor array of interest.

EXAMPLES

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Example 1: Laser Written resistor and capacitor in thin film molybdenum disulfide. A molybdenum disulfide ($MoS_2$) thin film of thickness totaling 900±50 nm was deposited onto a metal patterned glass or $SiO_2$ wafer via magnetron sputtering using a 99.95% pure $MoS_2$ target and Ti/Au contacts. The direct laser writing of resistors and capacitors was possible using a 514 nm laser and creating conducting $MoO_2$ patterns and insulating $MoO_3$ isolation with the Ti/Au contacts. The resistance can be controlled in a resistor component by varying the length of conductive material within the amorphous material, with the required $MoO_3$ isolation surrounding. Additionally, comb capacitors shown with tailored electronic properties are possible via patterning of the same materials but in different configurations.

Example 2: Gas sensor laser written in molybdenum disulfide Active circuit elements were also possible using the laser writing technique by taking advantage of the on/off properties of semiconducting 2H—$MoS_2$. One example of this is the laser writing of a chemresistor style gas sensor that can detect ammonia at sub 10 ppm levels. This chemresistor was composed of a semiconducting crystalline $MoS_2$ channel, metallic contact pads and electrodes, and a $MoO_3$ boundary isolation and was demonstrated to detect 10, 100, and 1000 parts per million of $NH_3$ gas.

Example 3: The first five materials listed in Column 4 of Table 1 below were made in accordance with Applicants' process on metallic contacts using a laser and then the same results were obtained using a lamp. Such materials are useful as listed in Column 5 of Table 1. The last 6 materials listed in Column 3 of Table 1 below are made in accordance with Applicants' process using a laser and then the same results were obtained using a lamp. Such materials are useful as listed in Column 5 of Table 1. The Examples in Table 1 row 1, 2, 5, 9 and 10 of column 4 show a crystalline structure changes in the starting material as represented by 2H, 1T, T-Phase and H-Phase while Examples in Table 1 row 3, 4, 6, 7, 8 and 9 of column 4 show a chemical change in the starting material.

TABLE 1

| Starting Material | Fluid blanket | Methodology | Post-annealed material | Use |
|---|---|---|---|---|
| Amorphous | Vacuum | Crystallization | 2H-$MoS_2$ | Semiconductor |
| $MoS_2$ | Vacuum | Crystallization | 1T-$MoS_2$ | Conductor |
| | Oxygen gas | Oxidation (Shorter annealing time) | $MoO_2$ | Conductor |
| | Oxygen gas | Oxidation (longer annealing time) | $MoO_3$ | Insulator |
| Amorphous $WS_2$ | Vacuum | Crystallization | 2H-$WS_2$ | Semiconductor |
| Amorphous TiS | Oxygen gas | Oxidation | TiO | Conductor |
| | Oxygen gas | Oxidation | $TiO_2$ | Semiconductor |
| | Nitrogen gas | Nitridization | TiN | Conductor |

TABLE 1-continued

| Starting Material | Fluid blanket | Methodology | Post-annealed material | Use |
|---|---|---|---|---|
| Amorphous $VS_2$ | Vacuum | Crystallization | T-phase $VS_2$ | Insulator |
| | Vacuum | Crystallization | H-phase $VS_2$ | Semiconductor |
| | Oxygen gas | Oxidation | $VO_2$ | Insulator |

Example 4. P-N Junction with Laser Written $MoS_2/WSe_2$ Lateral P-N junctions are made possible through first deposition of metallic contacts followed by patterned amorphous deposition of in-plane heterjunctions of amorphous $MoS_2/WSe_2$ structures. With the use of one laser pass across the interface, a n-type semiconductor $MoS_2$ is in contact with a p-type $WSe_2$ semiconductor material, forming a P-N junction of use for light emitting diodes (LEDs) and other optical/electronic components.

Example 5: Sensor device with laser written $MoS_2$, patterned metal contacts and patterned ablated material. Multiplexed sensor devices require electrical isolation to ensure minimal cross-talk between laser written devices. With this in mind, laser patterned areas of crystallized $MoS_2$ were fabricated and the same laser was used to trace around the area that was annealed to remove all material within that region in creating an electrically isolated circuit. The ablation process removed in total about 1% area of the total $MoS_2$ film.

Figure 2:
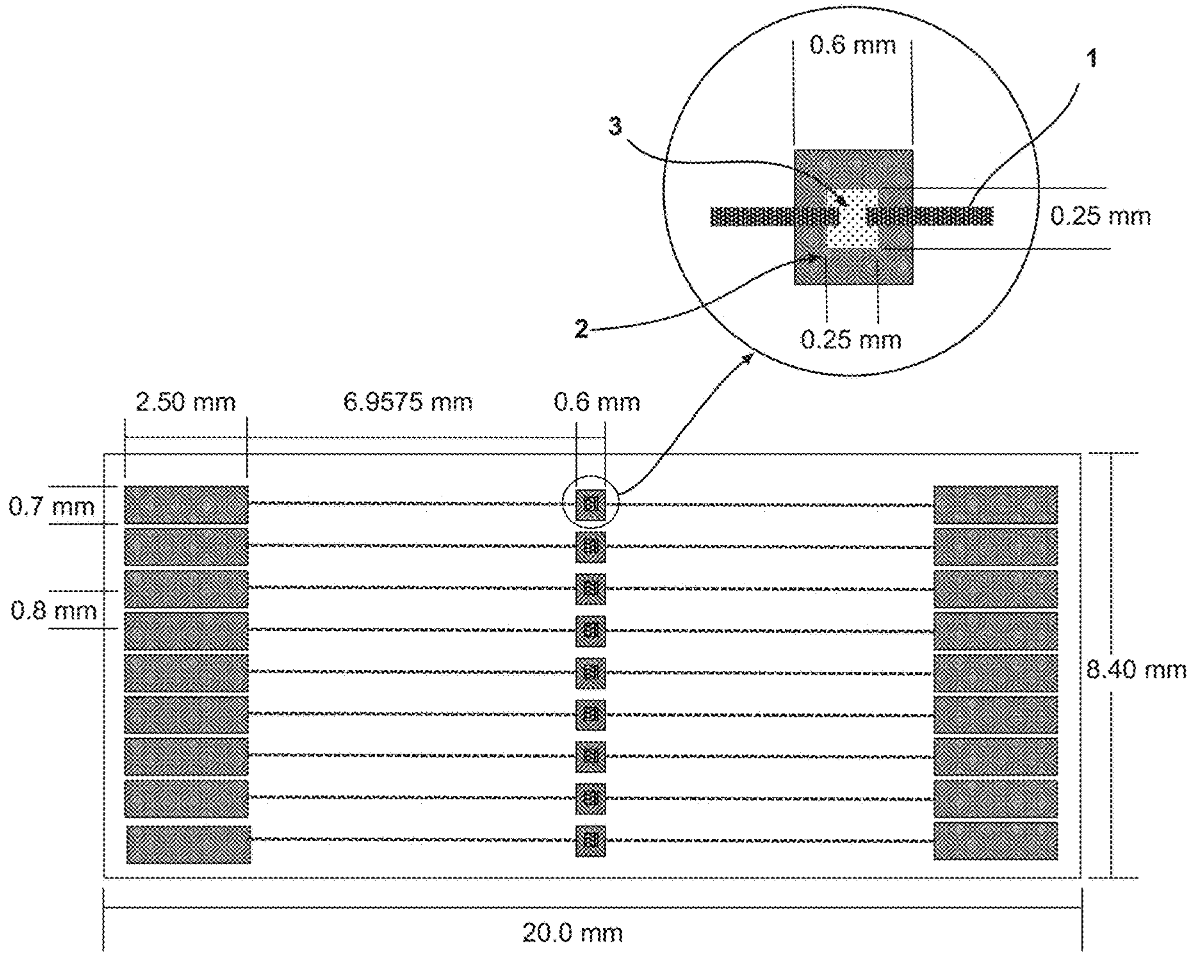
FIG. 2 is an example laser processed device configuration with deposited $MoS_2$ on prepatterned metal contacts and subsequent conversion showing in additional detail Metal electrodes (1), Amorphous $MoS_2$ (2) and Laser crystallized $MoS_2$ (3).
Figure 3A:
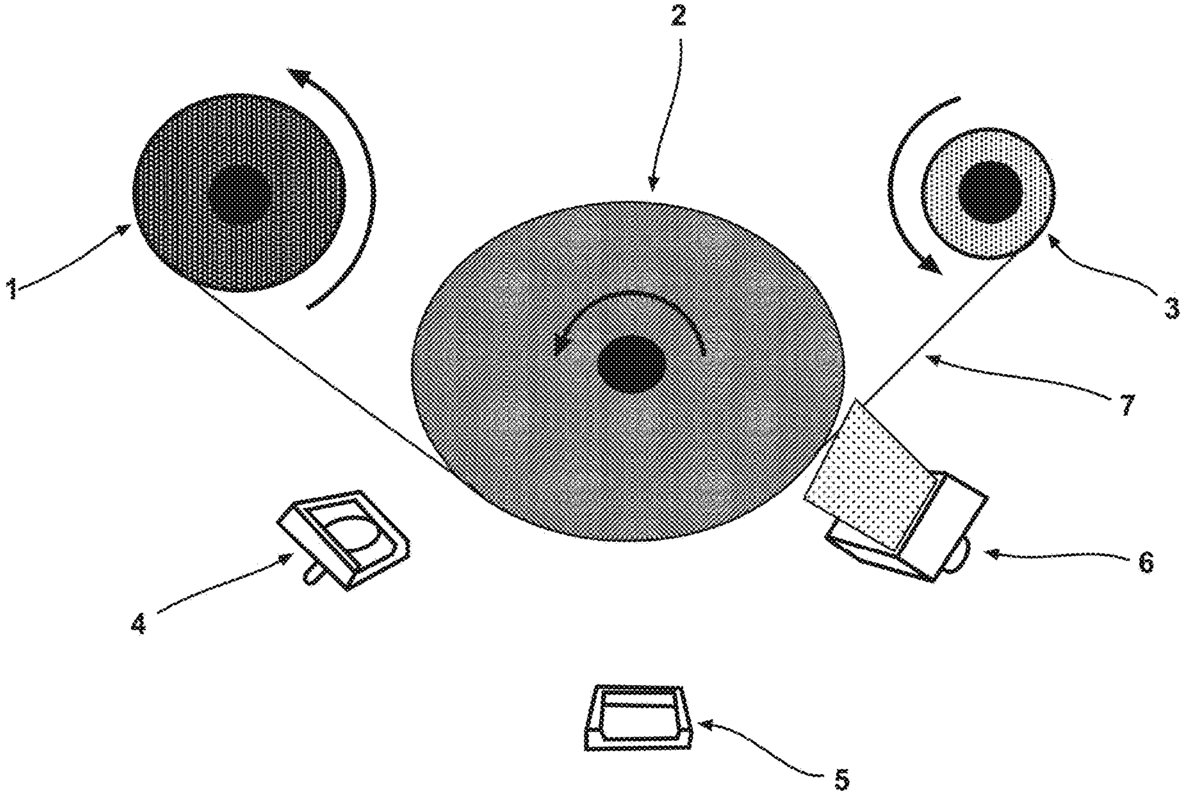
FIG. 3A is an example of the first unit operation in a roll-to-roll deposition of $MoS_2$ onto metal patterned substrates with subsequent laser annealing showing Feed roll (1), Main roller (2), Receiving roller (3), $MoS_2$ sputtering target (4), Laser (5), Metal sputtering target (6) and Flexible glass substrate (7).
Figure 3B:
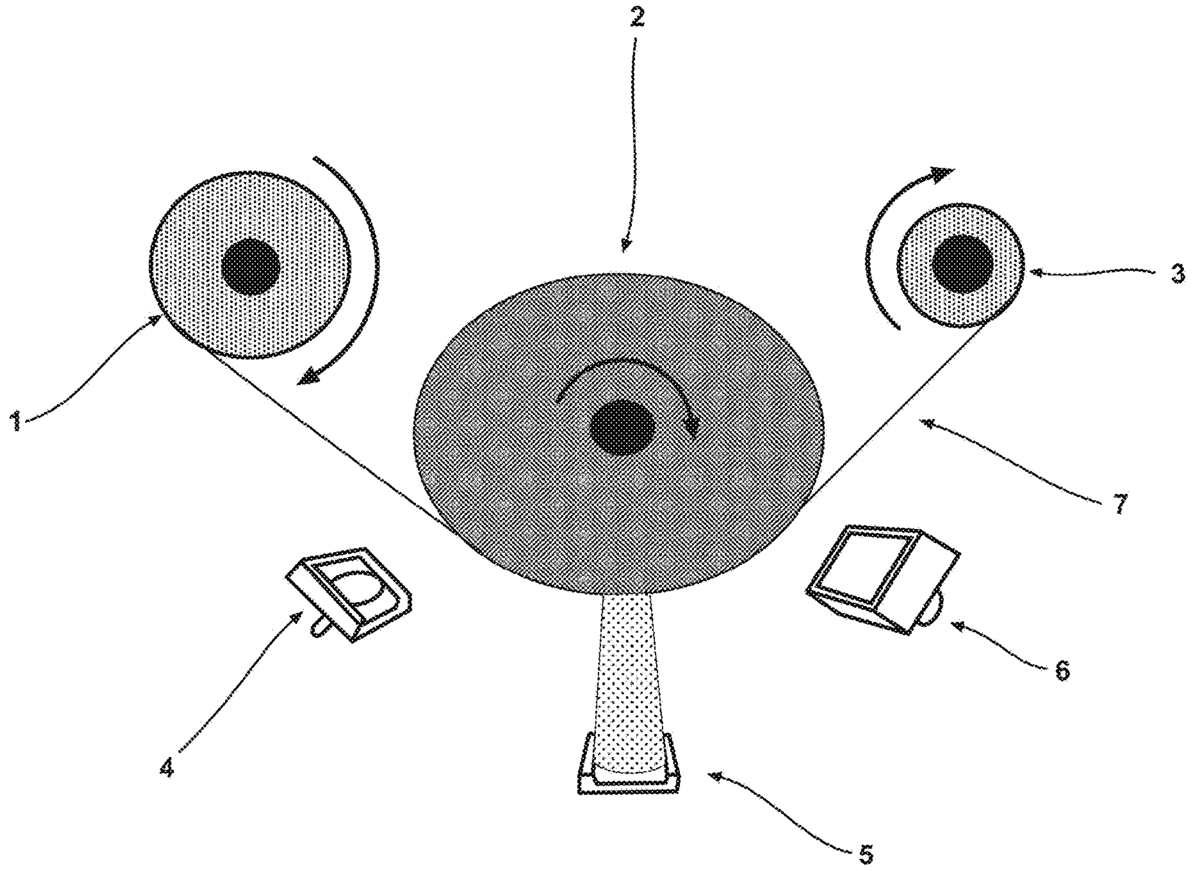
FIG. 3B is an example of a second unit operation in a roll-to-roll deposition of $MoS_2$ onto metal patterned substrates with subsequent laser annealing showing Receiving roll (1), Main roller (2), Feed roll (3), $MoS_2$ sputtering target (4), Laser (5), Metal sputtering target (6), and Flexible glass substrate (7).
Figure 3C:
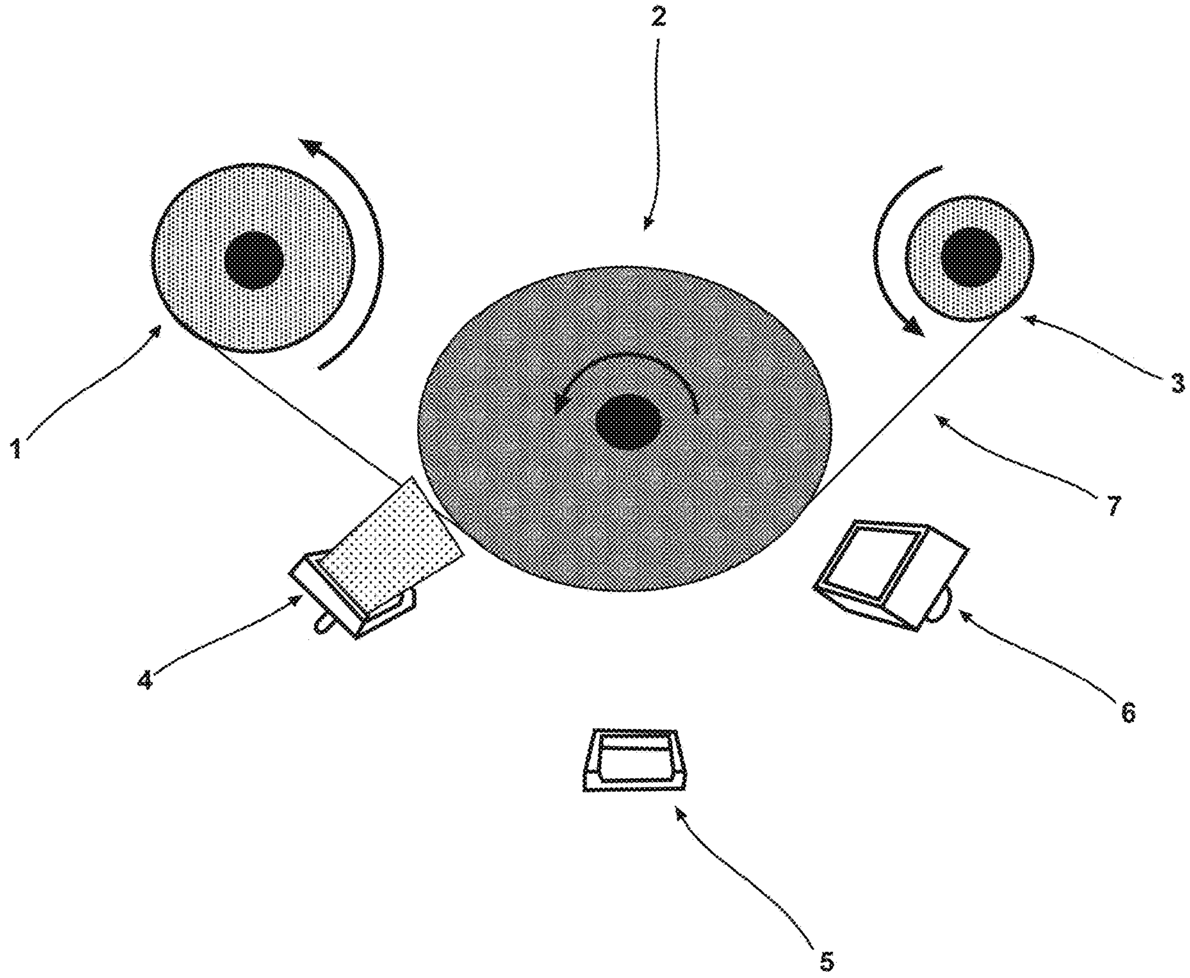
FIG. 3C is an example of a third unit operation in a roll-to-roll deposition of $MoS_2$ onto metal patterned substrates with subsequent laser annealing showing Feed roll (1), Main roller (2), Receiving roller (3), $MoS_2$ sputtering target (4), Laser (5), Metal sputtering target (6), and Flexible glass substrate (7).
Figure 3D:
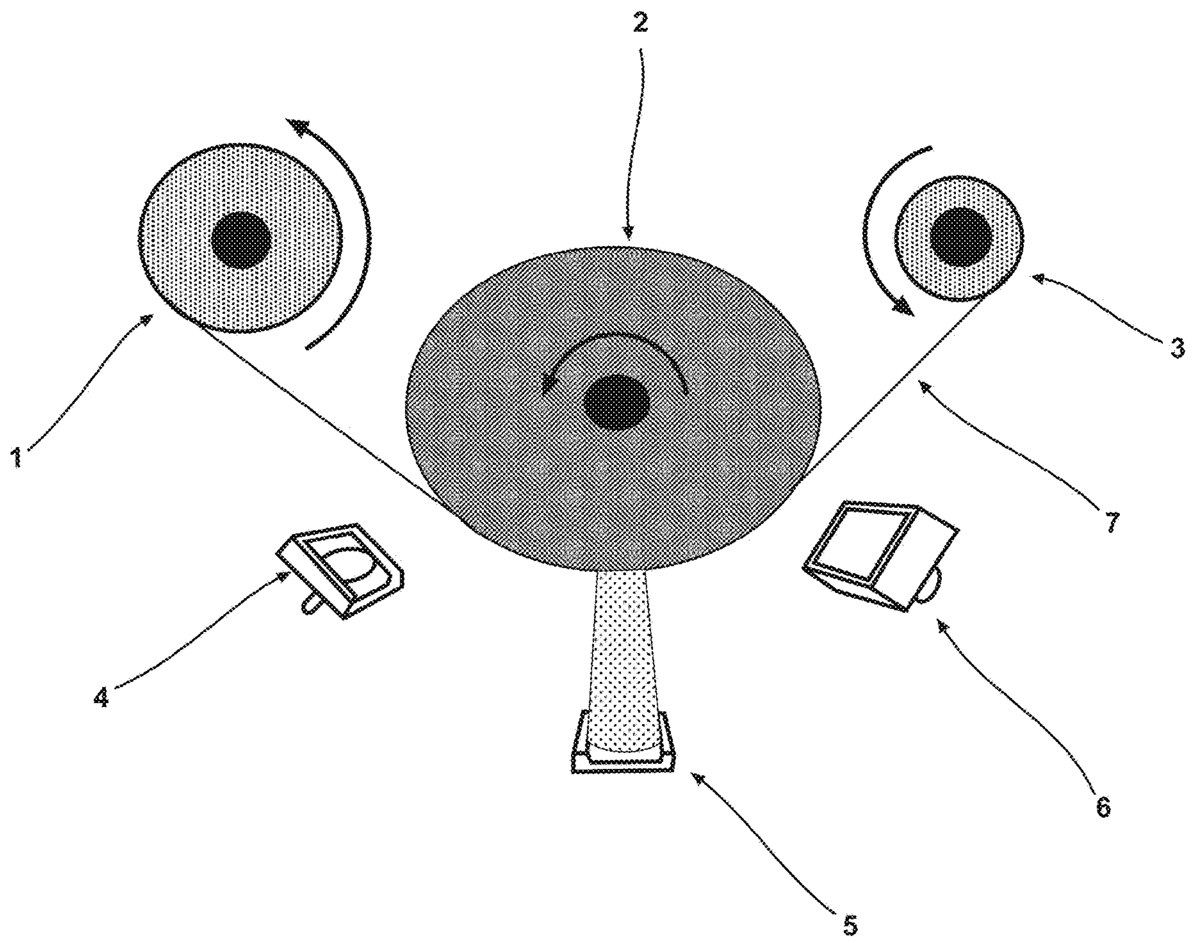
FIG. 3D is an example of a fourth unit operation in a roll-to-roll deposition of $MoS_2$ onto metal patterned substrates with subsequent laser annealing showing Receiving roll (1), Main roller (2), Feed roll (3), $MoS_2$ sputtering target (4), Laser (5), Metal sputtering target (6), and Flexible glass substrate (7).
Figure 4:
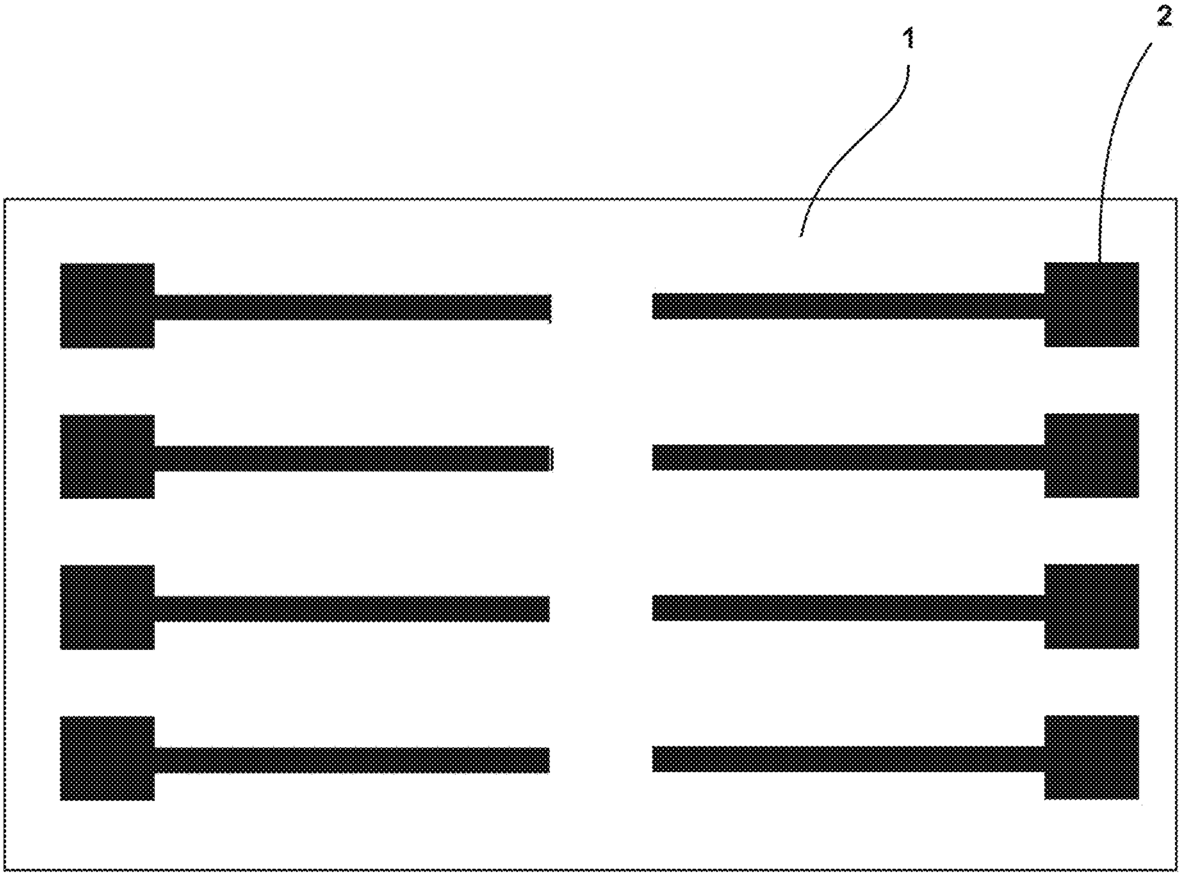
FIG. 4 is an example of a pattern for the pattern illumination-based annealed, coated substrate's patterned electrical conductive material (2) on a substrate (1) of the present invention.
Figure 5:
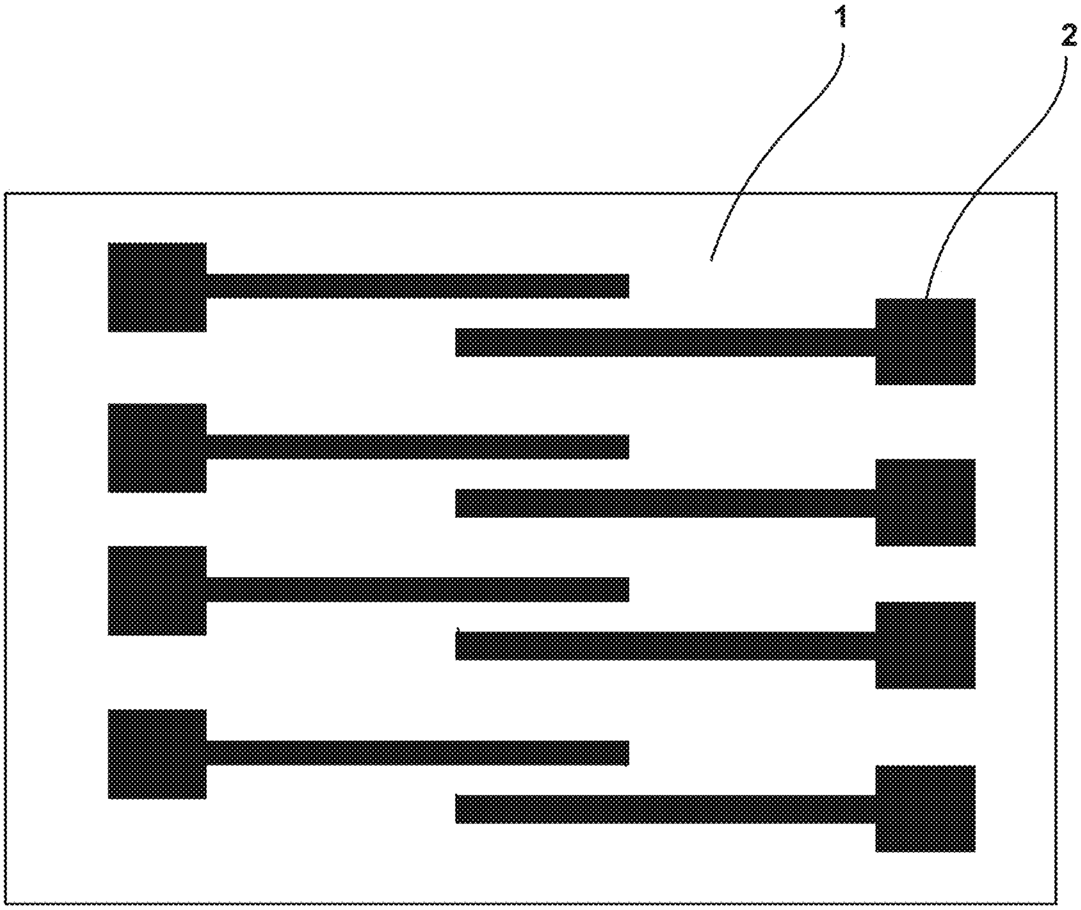
FIG. 5 is an example of a pattern for the pattern illumination-based annealed, coated substrate's patterned electrical conductive material (2) on a substrate (1) of the present invention.
Figure 6:
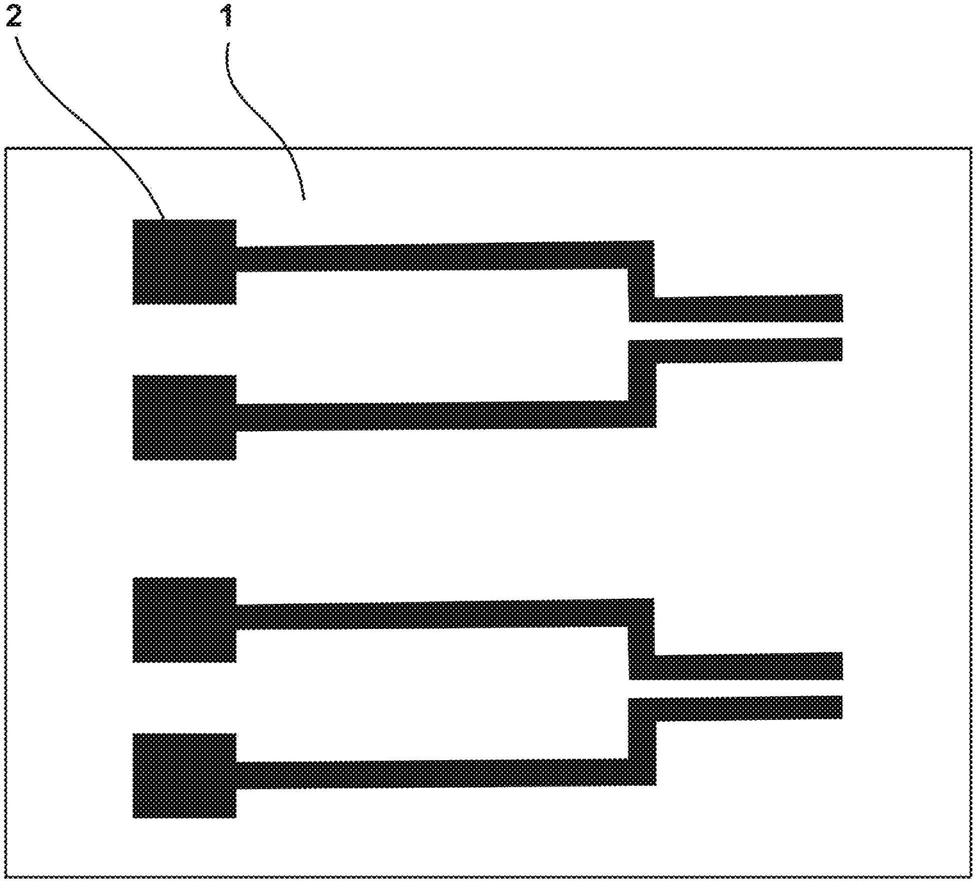
FIG. 6 is an example of a pattern for the pattern illumination-based annealed, coated substrate's patterned electrical conductive material (2) on a substrate (1) of the present invention.
Figure 7:
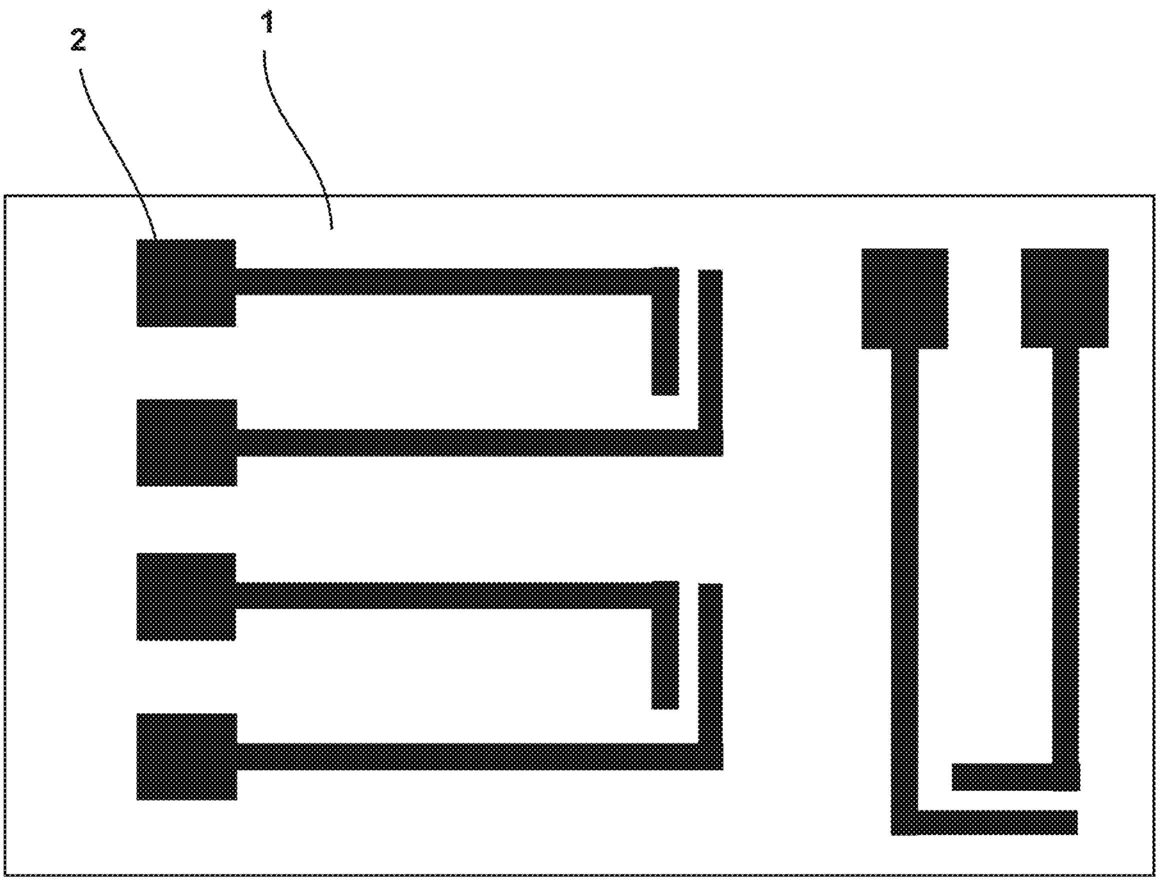
FIG. 7 is an example of a pattern for the pattern illumination-based annealed, coated substrate's patterned electrical conductive material (2) on a substrate (1) of the present invention.
Figure 8:
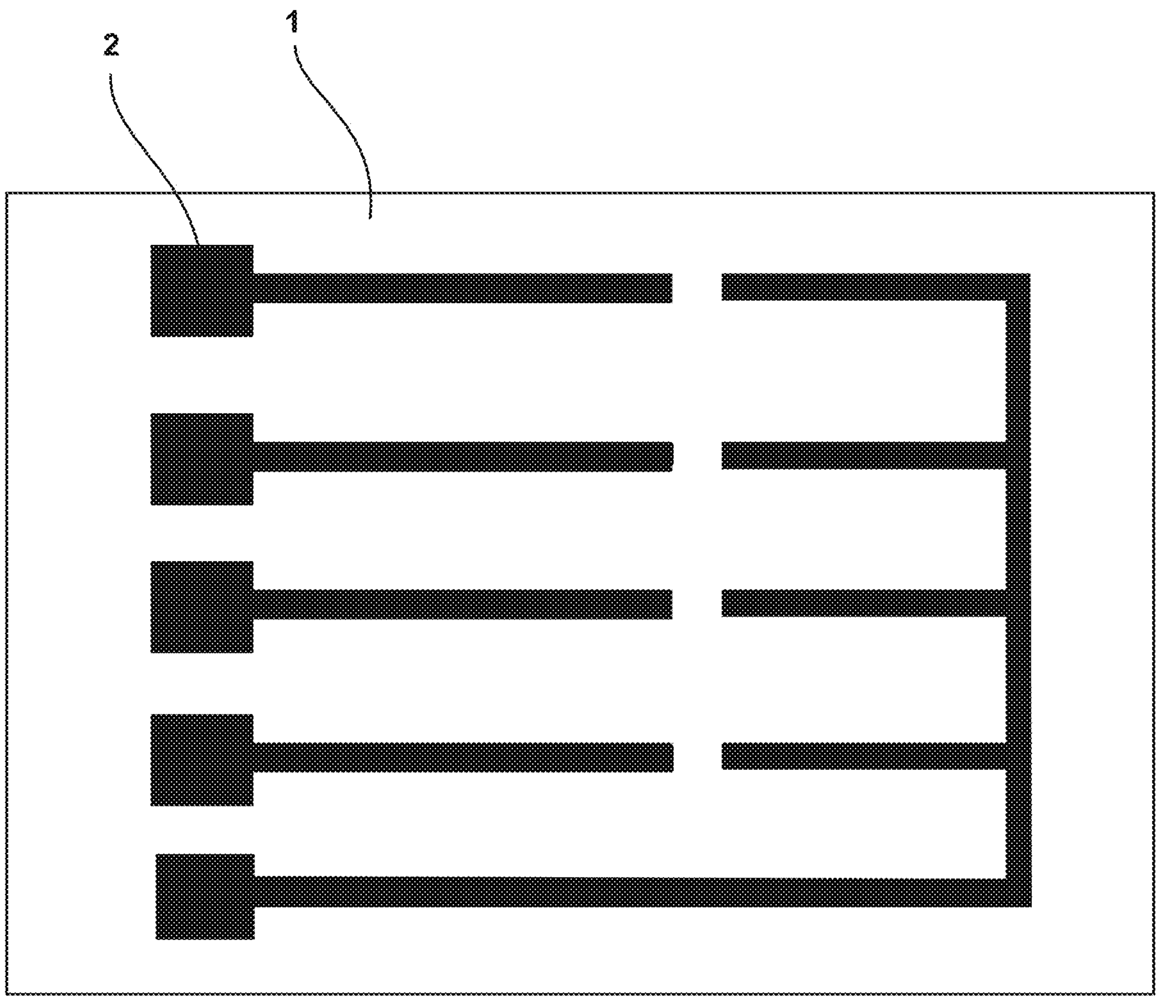
FIG. 8 is an example of a pattern for the pattern illumination-based annealed, coated substrate's patterned electrical conductive material (2) on a substrate (1) of the present invention.
Figure 9:
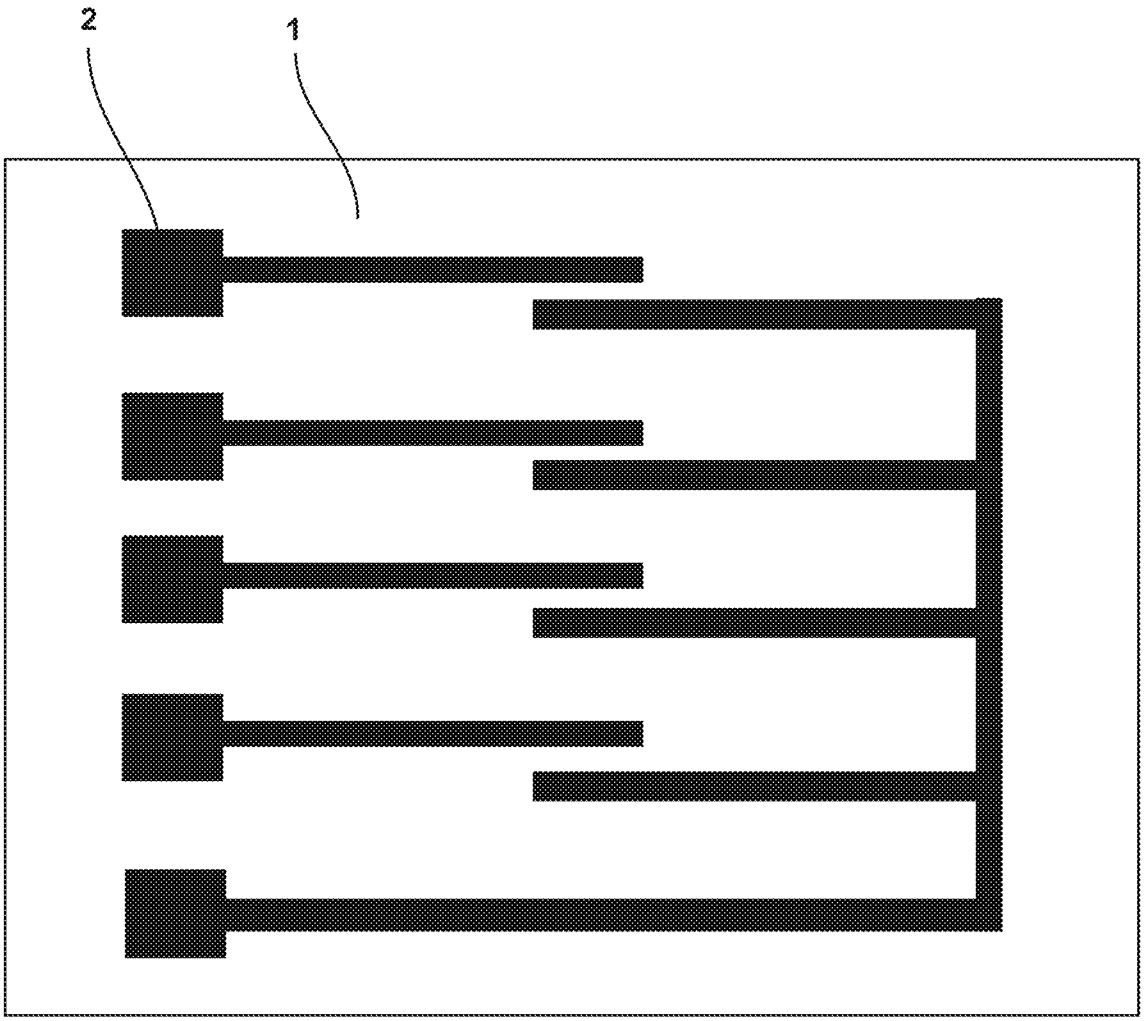
FIG. 9 is an example of a pattern for the pattern illumination-based annealed, coated substrate's patterned electrical conductive material (2) on a substrate (1) of the present invention.

Example 6: Laser written chemical or biological sensor on e-beam evaporated patterned metal on glass substrate. A prepatterned metal film composed of gold or molybdenum metal in a pattern was first deposited on a glass substrate as depicted in FIG. 1 and FIG. 2. A thin 3 nm molybdenum disulfide film is then sputter coated onto the glass/patterned metal substrate to form a continuous thin film. A CW laser is then utilized to crystallize the amorphous $MoS_2$ film to convert into semiconducting 2H—$MoS_2$ for sensing applications. The chemical sensor is then electrically isolated through laser ablation removal of the amorphous $MoS_2$ film around the crystallized 2H—$MoS_2$ to form a chem/bio sensor configuration.

Example 7: All laser written sensor on ablated metal pattern in roll-to-roll configuration. A roll-to-roll process is utilized to run a spool of flexible glass through a sputter-coater, laser processing system as depicted in FIG. 3. First, a thin layer of molybdenum or gold metal is deposited over the entire glass substrate and the laser is used to ablate a pattern in such a configuration as identified in FIGS. 4-9. The laser-ablated patterned metal film is then coated with 3 nm $MoS_2$ over the entire glass/metal substrate. Immediately following, a laser ablation step is used to remove all or some fraction of the amorphous $MoS_2$ except an area connecting the metal contacts, which is then laser annealed at a lower laser energy condition than that used for ablation to induce crystallization in a phase such as the hexagonal 2H—$MoS_2$ formation. The resultant devices are an embodiment of an all-laser fabrication roll-to-roll approach for chem/bio sensor fabrication. To monitor the degree and success of laser crystallization, a camera and Raman spectrometer was mounted in such a way to monitor the process at the main laser location. Additionally, to perform additional quality control, an optical light source and detector was mounted downstream to the process to evaluate broadband light transmission and absorption through the coated substrate.

Figure 10:
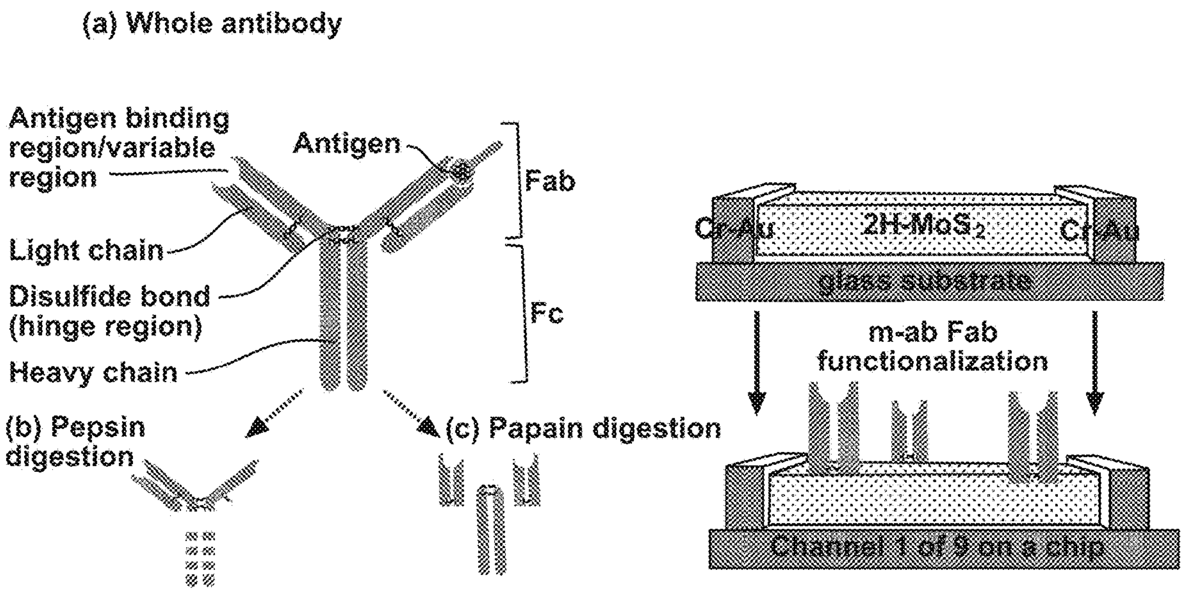
FIG. 10 is an example of biomolecular interactions with sensor devices to promote specific interactions with a target biomolecule.

Example 8: For direct binding of proteins, the sulfur chemistry of antibody fragments at their cysteine and proline-rich hinge region may be exposed via papain digestion to interact with the $MoS_2$ region of the sensor device which may have some concentration of atomic sulfur vacancies as shown in FIG. 10. The presence of these vacancies may result in interactions that may include covalent or electrostatic binding of antibody fragments or some combination thereof.

Figure 11A:
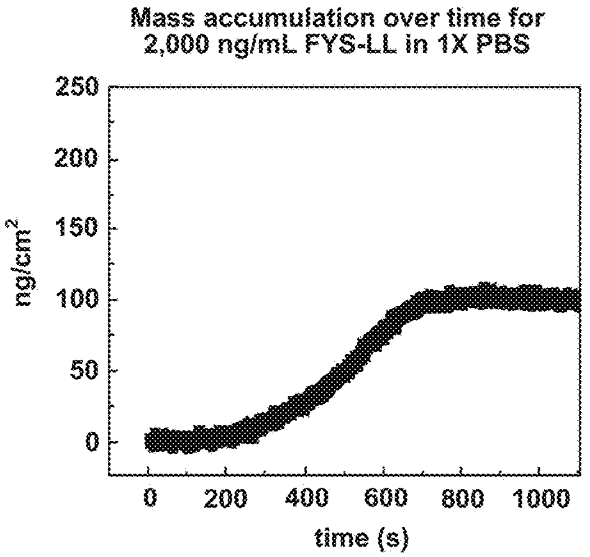
FIG. 11A is an example of measurement of mass accumulation rate (concentration of 2,000 ng/mL over time) of a peptide having terminated with two leucine amino acids to strengthen interactions with the $MoS_2$ substrate.
Figure 11B:
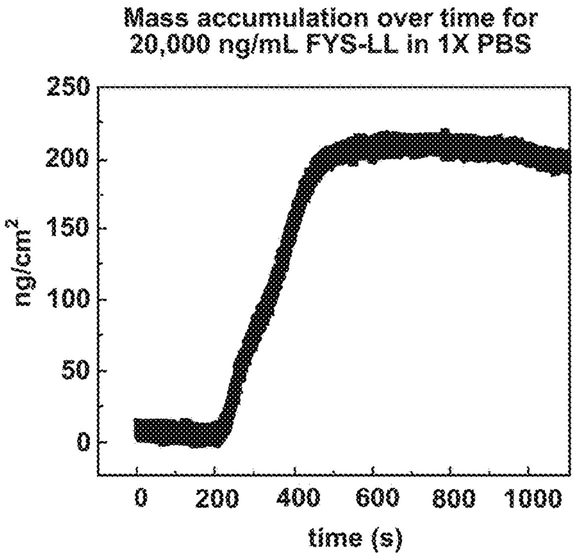
FIG. 11B shows attachment of a concentration of 10,000 ng/mL of a peptide over time, with washing steps in phosphate buffered saline and water after attachment with little or no mass loss during washing steps.

Example 9: Addition of amino acids to a target-binding peptide for interaction of target binding peptide with sensor surface is shown in FIG. 11. Two leucine amino acids are added to a c-TnI binding peptide. Interaction strength of the peptide with the sensor surface may be due in part to formation of a hydrophobic pocket with the leucine addition. Accumulation rates are shown for flowing solutions of two different peptide concentrations in a 1× concentration of phosphate buffered saline (PBS) on a $MoS_2$ surface. For the higher peptide concentration example, washing of the surface with 1× concentration phosphate buffer solution or doubly deionized water does not change the accumulated mass, suggesting strong interactions between the modified peptide and the $MoS_2$ substrate.

Figure 12A:
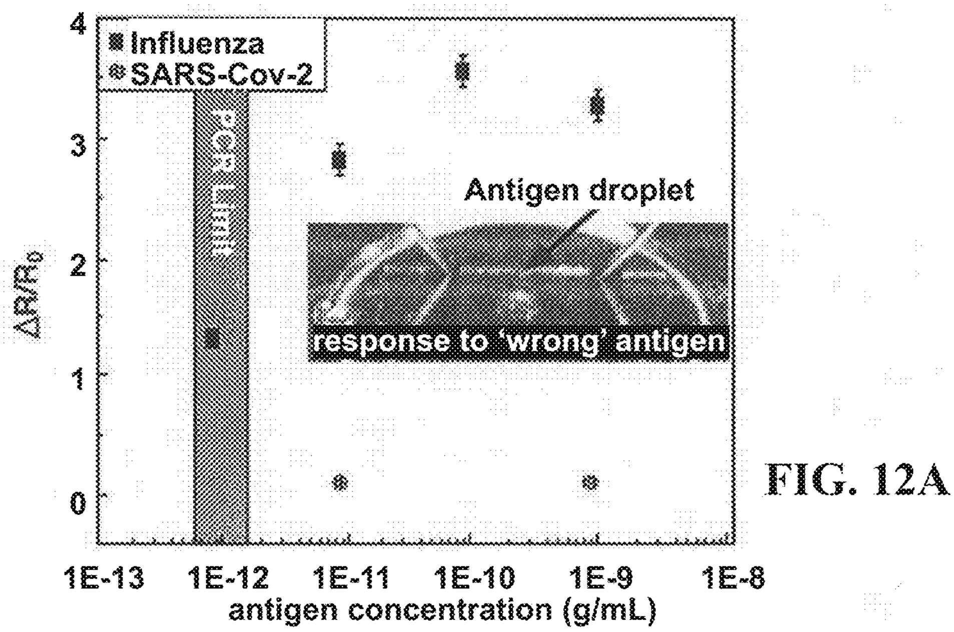
FIG. 12A is an example of electrical measurements from a sensor device with a laser-illuminated $MoS_2$-based rectangular sensor area (approximately 250 micrometers by 200 micrometers) with a concentration of influenza A hemagglutinin (HA) monoclonal antibody fragments applied to the surface via pipetting of a solution containing the antibody fragments in a buffer solution. Measurements of relative resistance changes for the indicated concentrations of Influenza A hemagglutinin and also the indicated concentrations of SARS-CoV-2 spike protein are depicted.
Figure 12B:
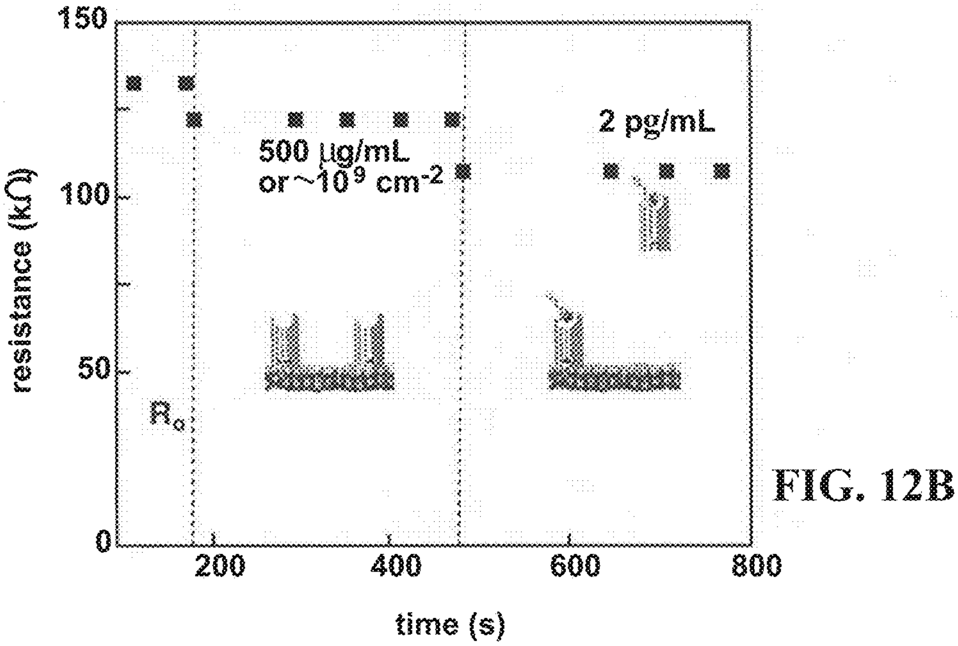
FIG. 12B shows the time response of resistance for a sensor device during functionalization with influenza A hemagglutinin (HA) monoclonal antibody fragments and subsequent attachment of influenza A hemagglutinin at the times indicated on the figure.
Figure 13:
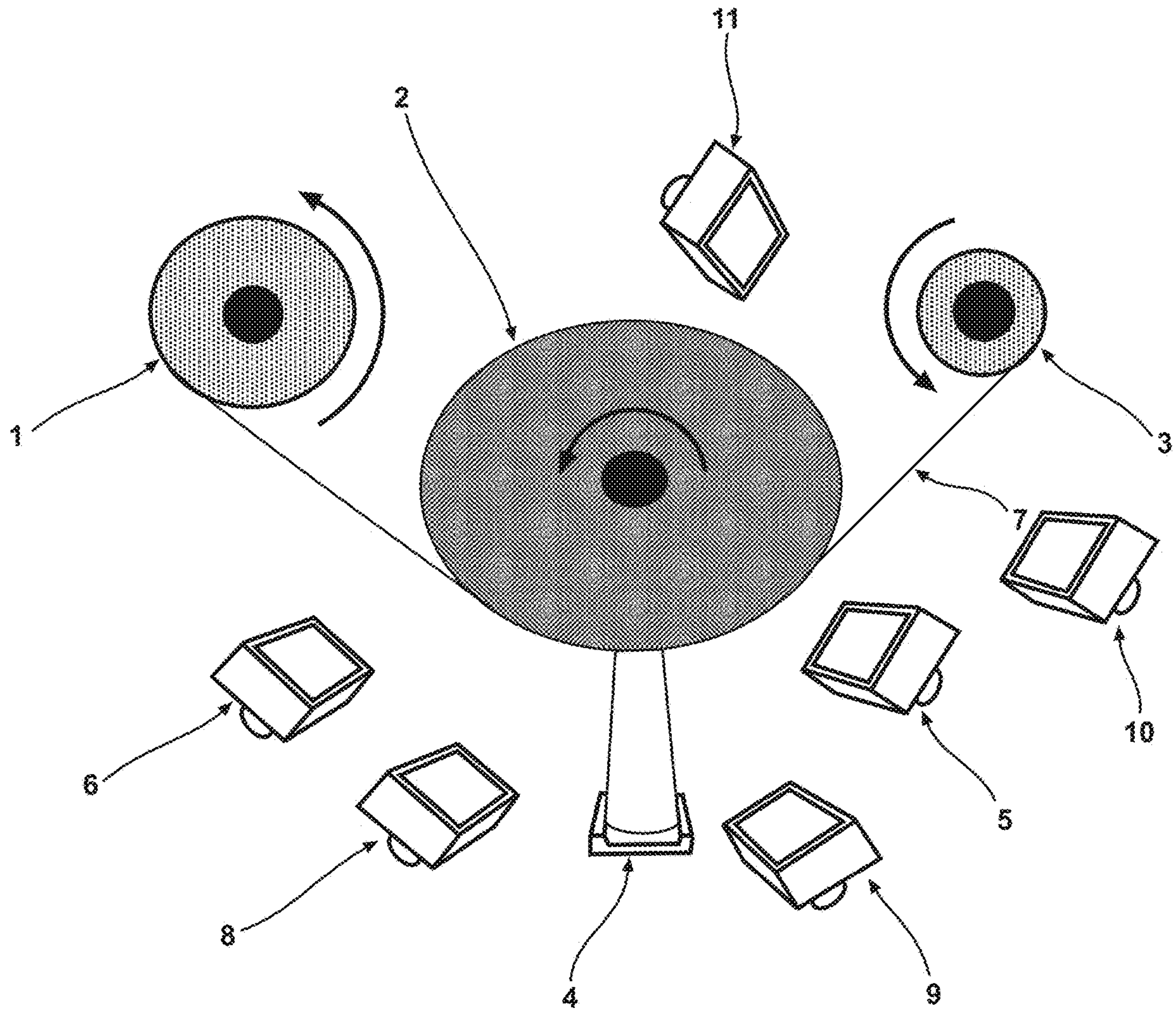
FIG. 13 depicts a roll to roll fabrication process with in-situ diagnostic tools both at the location of the laser processing as well as another location in the roll post-processing showing receiving roll (1), main roller (2), feed roll (3), laser (4), metal sputtering target (5), $MoS_2$ sputtering target (6), flexible substrate (7), and diagnostic tools (8), (9), (10), and (11).
Figure 14:
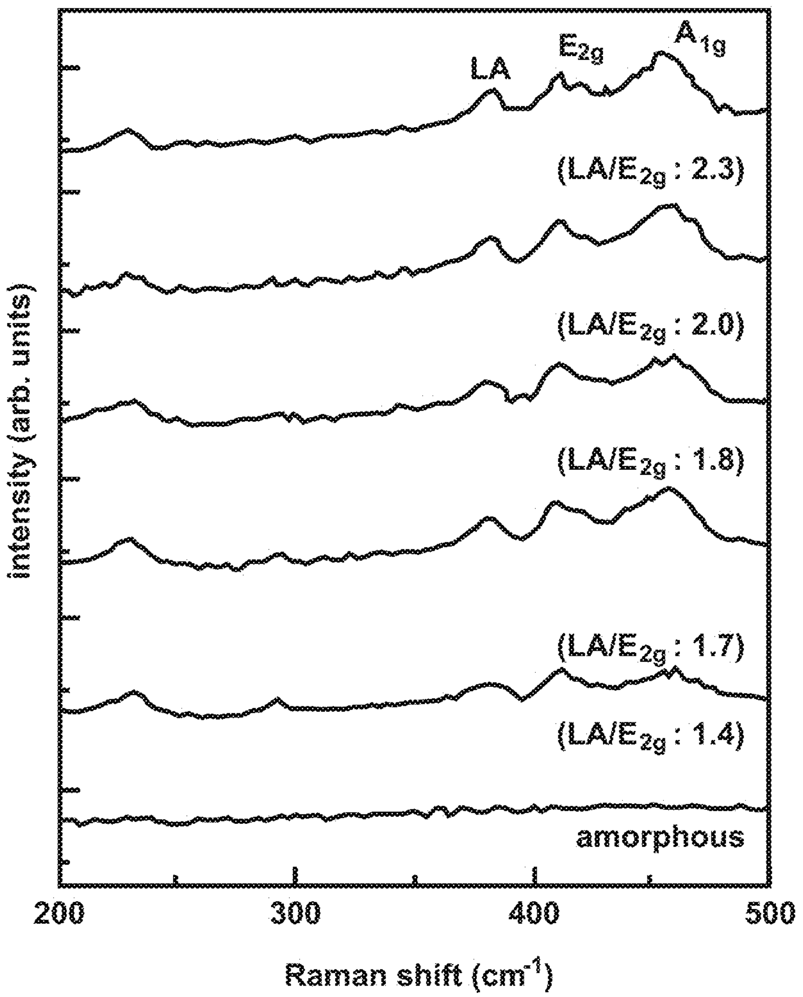
FIG. 14 shows resonant Raman spectrum taken using a 633 nm laser of laser treated 2H—$MoS_2$ regions.
Figure 15:
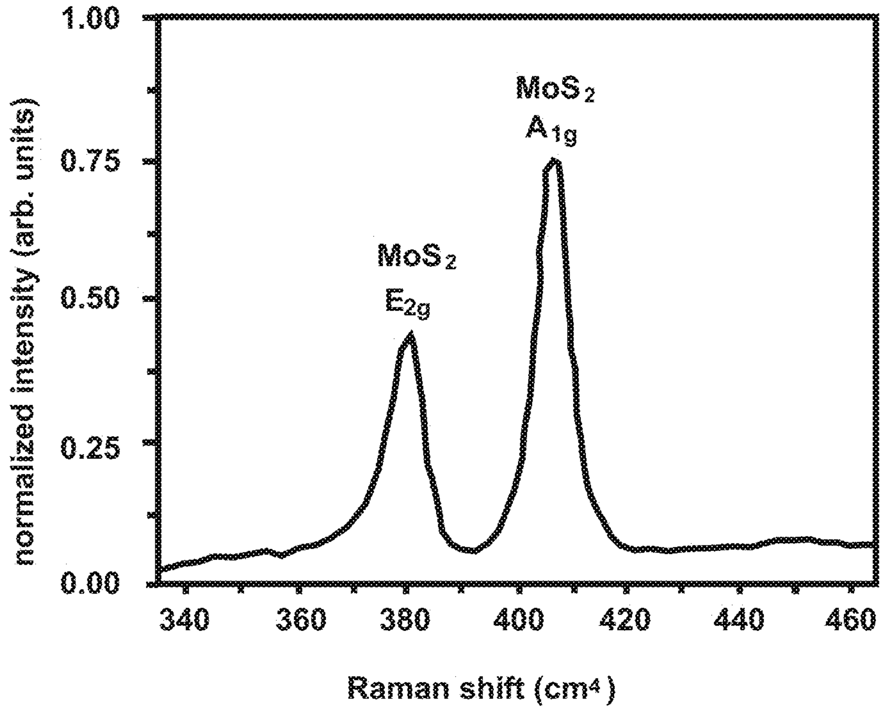
FIG. 15 depicts a Raman spectrum of laser treated 2H—$MoS_2$ region.
Figure 16:
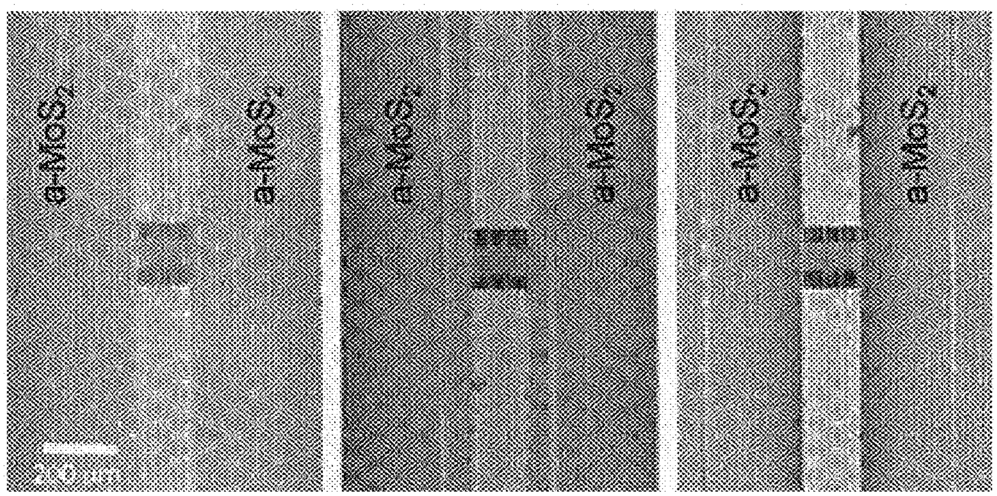
FIG. 16 shows optical images of roll to roll sensor devices.

Example 10: A single chip with multiple sensors and antibody fragments applied for specific binding to a target analyte of interest is shown in FIG. 12. On two sensor devices functionalized with influenza A HA protein monoclonal antibody fragments, concentrations of SARS-CoV2 spike protein (as indicated by the x axis) were applied and a much smaller sensor response was observed that at the same concentration of the complementary influenza HA analyte, demonstrating the utility of antibody functionalization for specific detection. The time response of the sensor is shown where a change in resistance is recorded within seconds of the application of the antibody fragments suggesting a rapid interaction once applied. The response time for application of the analyte is also shown to be within seconds which is expected for sensors with dimensions on the order of ~100 micrometers.

Example 11: Thick $MoS_2$ with laser annealing and metal contacts occurring on or within the film to form 3D device. A thick (100 micrometers) amorphous film of $MoS_2$ is deposited onto a glass substrate with patterned metal contacts. A sensor device is laser annealed into the film occur in several stepwise procedures both at the surface of the film and within the depth. First, an area of the film outside of the active device area is laser ablated where the entirety of the film is removed in select areas. Within the remaining film, a focused nanosecond laser is used to crystallize the surface of $MoS_2$ (<1 micrometer) for the active region of the sensor, leaving the remaining 99% within the thickness unaltered. Then, a continuous wave laser is used to oxidize regions of the film through the entire thickness in order to form conductive $MoO_3$ to serve as isolation in a multiplex sensor device. Finally, a peptide molecule is attached to the laser treated crystallized $MoS_2$ region in order to operate as a biomolecular sensor selective to the antigen of interest.

Example 12: A laser system suitable for inducing ablation or transformations within a material may also have an integrated 'sighting' laser operated at a different wavelength, intensity, or both wavelength and intensity for determining the distance from the sample to the laser. The sighting laser may have a wavelength suitable for interrogation of materials structure, such as 633 nm for identification of resonant Raman peaks in $MoS_2$ as the material is illuminated by the laser or after it interacts with the laser.

Example 13: A nine-channel array of $MoS_2$-based sensor devices thermally annealed in $1.5\times10^{-4}$ Torr nitrogen gas background at a temperature of 375° C. yields devices with measured electrical resistance values with a coefficient of variance between all measured values on the array of about 5%. Raman spectra of each device on the sensor array show similar Raman spectra to each other and similar Raman spectra to devices annealed using other means for annealing and crystallization for sensor materials described herein.

Example 14: A sensor array fabricated from materials selected to facilitate recyclability, including a glass substrate, molybdenum electrical contacts with 50 nm thickness and an MoS2 semiconducting sensor region with 3 nm thickness. After use, the sensor array may be heated in air or an oxidizing environment such that the Mo electrical contacts and the $MoS_2$ semiconducting sensor region sublimate at a temperature of about 680° C. when heated in air, leaving a glass surface that may be reused, repurposed, or recycled.

Example 15: Droplets of about 100 nano-liters in volume containing antibody fragments are applied to sensor arrays fabricated via laser patterning steps. The droplet demonstrates two different responses depending upon the region of the laser patterned sensor materials it interacts with. The drop demonstrates a small contact angle on the smooth laser-patterned sensor surface, indicating more hydrophobic behavior and a large contact angle on the rough laser-patterned sensor surface indicating more hydrophilic behavior. The drop shape deviates from the spherical shape observed on a smooth surface, and the planar morphology on the rough surface when interacting with a rough surface adjacent to a smooth surface.

Example 16: Increased limit of detection from thermal annealing of a 9-channel sensor array is shown by comparison of magnitude of change in electrical resistance values from a 2D MoS2-based sensor transducer with dimensions 250×85 microns for measurement of SARS-CoV-2 viral proteins. For an as-fabricated sensor with no thermal annealing, sample volumes of 1 microliter with concentrations below 2 ng/mL result in average resistance changes less than 3 times the standard deviation of the signal from a nine-channel array with an applied 1 microliter negative control sample. Sensor devices annealed at 325° C. in an ambient nitrogen environment for 10 minutes show responses greater than 3 times the standard deviation of the signal for concentrations of 0.02 pg/mL The measurements were performed with a resistance measurement circuit applying current preferably in the range of 0.001 picoAmp to 100 microAmp, more preferably 10 picoAmp to 100 nanoAmp, and most preferably 100 picoAmps to 10 nanoAmps for measurement of voltage across the $MoS_2$ transducer for calculation of electrical resistance.

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and process, and illustrative examples shown and described. Accordingly, departures may be made from such details without departing from the scope of the general inventive concept.

What is claimed is:

1. A process of making a plurality of sensors or sensor arrays comprising:

a) applying one or more coatings of electrically conductive material over a substrate having a first side and a second side, said one or more coatings of electrically conductive material being applied over at least the first side of said substrate;

b) removing a portion of said electrically conductive material to form a pattern of electrically conductive material electrodes on said substrate, wherein said pattern of electrically conductive material electrodes comprise a plurality of pairs of electrically conductive material electrodes that have a gap between the electrodes in each pair of electrodes, wherein said pairs of electrically conductive material electrodes are spaced apart from each other on said substrate;

c) applying one or more chemical coatings in the form of a continuous film over said patterned electrical conductive material to form a coated substrate, wherein said gap is covered by said one or more chemical coatings, and (i) said patterned electrical conductive material comprises a material selected from the group consisting of poly(3,4-ethylenedioxythiophene), poly(3,4-ethylenedioxythiophene) polystyrene sulfonate, poly (pyrrole), polycarbazoles, polyindoles, polyazepines, Cr, Mo, Ti, Sc, Ni, V, Hf, W, Nb, Au, Ag, Cu, Pt, and mixtures thereof; and (ii) said one or more chemical coatings each independently comprising a transition metal and an element selected from the group consisting of hydrogen, carbon, nitrogen, oxygen, sulfur, selenium, phosphorous and mixtures thereof, said one or more chemical coatings each independently comprising at least one of an amorphous, nanocrystalline, microcrystalline or crystalline region; and d) illumination patterning, annealing and/or thermal annealing said coated substrate, said illumination patterning, annealing and/or thermal annealing comprising using one or more lasers and/or lamps to achieve at least one of a structural change or a change in crystallization in at least a portion of at least one of said one or more chemical coatings on said substrate, which change comprises forming a crystallized region of said one or more chemical coatings over said gap to form a sensor, and leaving an amorphous region surrounding said crystallized region, and the removal of at least a portion of said chemical coating on at least the first side of said substrate to leave a space between sensors, wherein said illumination patterning and/or thermal annealing is also applied to control the morphology or flow of an applied drop or a sample over the sensor or the sensor array surface by providing said sensor or sensor array surface, or portions thereof, with either: 1) a smooth laser-patterned sensor surface which demonstrates a smaller contact angle and a more hydrophobic surface with such an applied drop or sample; or 2) a rough laser-patterned sensor surface which demonstrates a larger contact angle and more hydrophilic surface with such an applied drop or sample.

2. A production process of making a plurality of sensors or sensor arrays according to claim 1 wherein said substrate is flexible and has a centerline, wherein said substrate moves past unit operations during said production process.

3. The production process of claim 2 wherein the removing in step b) is performed using a laser.

4. The production process of claim 2 wherein step d) is performed at a unit operation, and said process further comprises altering the illumination patterning of a portion of the sensor array surface that moves past the unit operation in step d) to change the surface properties of a portion of the sensor array surface to manipulate the morphology or flow of an applied drop or sample over the sensor surface and change the properties of the sensors being made at any point in the patterning process.

5. The process of claim 4 wherein said process is a roll process.

6. The process of claim 1 wherein said illumination patterning comprises contacting, from about 1 to about 1000 times, said surface with a continuous wave and/or pulsed laser, each said continuous wave and/or pulsed laser independently having a pulse frequency of from about 0.1 Hz to about 1000 kHz and a laser power density of from about 0.05 $J/mm^2$ to about 800 $J/mm^2$; and said thermal annealing being conducted under a pressure of from about $10\times10^{-10}$ Torr to about 7000 Torr in an atmosphere comprising nitrogen, oxygen, argon, helium, hydrogen, hydrogen sulfide, hydrogen selenide and mixtures thereof.

7. The process of claim 6 wherein said illumination patterning comprises contacting, from 2 or more times to about 10 times said surface with a continuous wave and/or pulsed laser each said continuous wave and/or pulsed laser independently having a pulse frequency of from about 100 Hz to about 100 kHz, and a laser power density of from 5 $J/mm^2$ to about 80 $J/mm^2$; and said thermal annealing being conducted under a pressure of from about $10^{-6}$ Torr to about 1 Torr in an atmosphere comprising at least 85% nitrogen and the balance of said atmosphere comprising argon and/or hydrogen, or said atmosphere comprises at least 85% argon and the balance of said atmosphere comprising nitrogen and/or hydrogen.

8. The process of claim 1 wherein the at least one chemical coating comprises amorphous and/or nanocrystalline $MoS_2$, and the change in crystallization in step d) comprises illumination patterning and/or thermal annealing amorphous and/or nanocrystalline to form 2H—$MoS_2$.

9. The process of claim 1 wherein said thermal annealing of said coated substrate is at a temperature of at least 325° C. in an ambient nitrogen environment for improved sensitivity.

10. The process of claim 1 further comprising a quality control unit comprising one or more diagnostic detectors, said one or more diagnostic detectors positioned to collect light that has interacted with said one or more chemical coatings at the point of and/or after said illumination patterning and/or thermal annealing has occurred, wherein said one or more diagnostic detectors are each independently an optical camera, an optical detector, or a Raman spectrometer.

11. The process of claim 1 further comprising a step e) of attaching one or more types of functional molecules and/or one or more complexes comprising one or more types of functional molecules and one or more target molecules to at least a portion of said illumination patterned, annealed and/or thermally annealed coated substrate, wherein said one or more functional molecules are biomaterials that are selected from the group consisting of: peptides, nanozymes, proteins, lipids, carbohydrates and lectins, nucleic acids and mixtures thereof.

12. The process of claim 11 wherein said biomaterial's attachment to said illumination patterned, annealed and/or thermally annealed coated substrate comprises at least one of a covalent bond, electrostatic bond, or a covalent and electrostatic bond.

13. The process of claim 12 wherein said biomaterial is attached to said illumination patterned, annealed and/or thermally annealed coated substrate by an electrostatic bond.

14. The process of claim 1 wherein:

at least one of said one or more chemical coatings comprises, prior to annealing, two or more regions that are amorphous, nanocrystalline, microcrystalline or crystalline with the proviso that at least two of said regions are not identical with respect to being amorphous, nanocrystalline, microcrystalline or crystalline and said laser or lamp forms on, within or on and within said at least one of said one or more chemical coatings:

(i) at least two electronic elements selected from a conductor, semiconductor and an insulator;

(ii) two or more different conductors having at least one of the following: different electrical properties or different optical properties;

(iii) two or more different semiconductors having at least one of the following: different electrical properties or different optical properties; or (iv) two or more different insulators having at least one of the following: different electrical properties or different optical properties;

said pattern illumination-based annealing and/or thermal annealing resulting in at least one of a chemical change or structural change, and the removal of at least a portion of at least one of said one or more chemical coatings and resulting in an electrical component, an optical component or a combined electrical and optical component being formed on, within or on and within at least a portion of said pattern illumination-based annealed and/or thermally annealed one or more chemical coatings.

15. The process of claim 1 further comprising performing steps a) to d) on the second side of said substrate as well.

16. The process of claim 1 wherein said transition metal is selected from the group consisting of molybdenum, tungsten, niobium, tantalum, vanadium, titanium, chromium, iron, rhodium, hafnium, rhenium and mixtures thereof.

17. The process according to claim 1 wherein said one or more chemical coatings comprises at least one region that is amorphous or nanocrystalline.

18. The process according to claim 1 wherein said pattern illumination-based annealing is achieved by using one or more lasers, said one or more lasers each being independently selected from a laser that is a pulsed laser, a continuous laser or a pulsed/continuous laser.

19. The process of claim 1 wherein, said each chemical coating independently has a thickness of from about 0.1 nanometers to about 1 centimeter.

20. The process of claim 1 wherein each of said one or more chemical coatings have an area and a thickness and said removal of said at least a portion of said one or more chemical coating occurs, said removal comprising at least one of:

a.) laser ablation removal of from about 0.1% to about 99.9% of at least one of said one or more chemical coatings' area; or b.) laser ablation removal of at least 85% of at least one of said chemical coatings' thickness; or laser ablation removal of about 85% to about 99% of at least one of said chemical coatings' thickness.

21. The process of claim 1 wherein said substrate of said coated substrate is selected from glass, polymer and mixtures thereof.

22. The process of claim 1 wherein at least a portion of said coated substrate's pattern illumination-based annealed chemical coating is further treated by at least one of the following processes:

a.) two or more pattern illumination-based annealings;

b.) plasma treatment comprising exposing said at least a portion of said coated substrate's pattern illumination-based annealed chemical coating to an ionized gas derived from the group consisting of He, Ne, Ar, Kr, Xe, $H_2$, $O_2$, $SF_6$, $CF_4$, $N_2$ and mixtures thereof;

c.) ion beam irradiation comprising exposing said at least a portion of said coated substrate's pattern illumination-based annealed chemical coating to an ion beam, said ion beam comprising an ionized gas derived from the group consisting of He, Ne, Ar, Kr, Xe, $H_2$, $O_2$, $SF_6$, $CF_4$, $N_2$ and mixtures thereof;

d.) electron beam illumination comprising exposing at least a portion of said coated substrate's pattern illumination-based annealed chemical coating to an electron dose of from about $10^2$ electrons/nm$^2$ to about $10^{25}$ electrons/nm$^2$;

e.) thermal annealing said at least a portion of said coated substrate's pattern illumination-based annealed chemical coating, said at least a portion of said coated substrate's pattern illumination-based annealed chemical coating's thermal annealing treatment temperature being from greater than about 250° C. to about 1,500° C.;

f.) chemically etching said at least a portion of said coated substrate's pattern illumination-based annealed chemical coating comprising contacting said at least a portion of said coated substrate's pattern illumination-based annealed chemical coating with an etching composition;

g.) electro-chemically treating said at least a portion of said coated substrate's pattern illumination-based annealed chemical coating by contacting said at least a portion of said coated substrate's pattern illumination-based annealed chemical coating with a chemical composition comprising an electrolyte and subjecting said contacted at least a portion of said coated substrate's pattern illumination-based annealed chemical coating and said chemical composition comprising an electrolyte to an electrical current;

h.) surface physical modification of at least a portion of said coated substrate's pattern illumination-based annealed chemical coating.

* * * * *